US011187727B2

(12) United States Patent
Mallett et al.

(10) Patent No.: US 11,187,727 B2
(45) Date of Patent: Nov. 30, 2021

(54) CAPACITANCE-COUPLED VOLTAGE TRANSFORMER MONITORING

(71) Applicant: Schweitzer Engineering Laboratories, Inc., Pullman, WA (US)

(72) Inventors: Travis C Mallett, Pullman, WA (US); Robert Lopez, Jr., Palouse, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 407 days.

(21) Appl. No.: 16/396,939

(22) Filed: Apr. 29, 2019

(65) Prior Publication Data
US 2020/0341035 A1    Oct. 29, 2020

(51) Int. Cl.
*G01R 15/06* (2006.01)
*H02H 7/05* (2006.01)
(Continued)

(52) U.S. Cl.
CPC ............. *G01R 15/06* (2013.01); *G01R 15/16* (2013.01); *G01R 15/18* (2013.01);
(Continued)

(58) Field of Classification Search
CPC ........ G01R 15/06; G01R 15/16; G01R 15/18; G01R 15/165; G01R 15/183;
(Continued)

(56) References Cited

U.S. PATENT DOCUMENTS 2,209,810 A    7/1940 Cordroy
3,401,304 A    9/1968 Woodworth
(Continued)

FOREIGN PATENT DOCUMENTS

CN    1138329    2/2004
CN    2682427    3/2005
(Continued)

OTHER PUBLICATIONS

S. Zhao; H. Y. Li; F. Ghassemi; P. Crossley; "Impact of Power Quality Sensor technique on power system protection voltage transient measurements"; Jul. 26, 2010; IEEE; pp. 1-4 (Year: 2010).*

(Continued)

*Primary Examiner* — Thienvu V Tran
*Assistant Examiner* — Shahzeb K Ahmad
(74) *Attorney, Agent, or Firm* — Richard M. Edge

(57) ABSTRACT

The present disclosure pertains to systems and methods for monitoring a capacitance-coupled voltage transformer (CCVT) in electrical communication with the electric power delivery system, the CCVT comprising a stack of capacitors and an electrical contact to a first ground connection. A first current transformer is disposed between the stack of capacitors and the first ground connection. The current transformer provides an electrical signal corresponding to a current associated with the CCVT. A second current transformer is disposed between a primary winding of a step-down transformer associated with the CCVT and a second ground connection. An intelligent electronic device (IED) in electrical communication with the current measurement devices monitors a ratio of magnitudes from the current transformers at a single frequency. The ratio is compared against an acceptable range. When the ratio exceeds the acceptable range, an alarm is generated.

20 Claims, 19 Drawing Sheets

(51) Int. Cl.
| | |
|---|---|
| *H02H 9/00* | (2006.01) |
| *G08B 21/18* | (2006.01) |
| *G01R 19/165* | (2006.01) |
| *G01R 15/16* | (2006.01) |
| *G01R 15/18* | (2006.01) |

(52) U.S. Cl.
CPC ..... *G01R 19/16547* (2013.01); *G08B 21/182* (2013.01); *H02H 7/05* (2013.01); *H02H 9/007* (2013.01)

(58) Field of Classification Search
CPC .......... G01R 19/16547; G01R 19/2513; G01R 31/088; G01R 31/11; H02H 7/05; H02H 7/265; H02H 9/007; G08B 21/182; H01F 27/425; H01F 27/427
See application file for complete search history.

(56) References Cited

U.S. PATENT DOCUMENTS

| | | | |
|---|---|---|---|
| 3,546,534 | A | 12/1970 | Kotos |
| 3,558,984 | A | 1/1971 | Smith |
| 3,684,948 | A | 8/1972 | Eissmann |
| 3,870,926 | A | 3/1975 | Hughes |
| 4,322,768 | A | 3/1982 | Maeda |
| 4,327,390 | A | 4/1982 | Despiney |
| 4,329,638 | A | 5/1982 | Le Maguet |
| 4,757,263 | A | 7/1988 | Cummings |
| 4,914,382 | A | 4/1990 | Douville |
| 5,272,439 | A | 12/1993 | Mashikian |
| 5,367,426 | A | 11/1994 | Schweitzer, III |
| 5,418,776 | A | 5/1995 | Purkey |
| 5,430,599 | A | 7/1995 | Charpentier |
| 5,473,244 | A | 12/1995 | Libove |
| 5,563,459 | A | 10/1996 | Kurosawa et al. |
| 5,627,415 | A | 5/1997 | Charpentier |
| 5,671,112 | A | 9/1997 | Hu |
| 5,703,745 | A | 12/1997 | Roberts |
| 5,805,395 | A | 9/1998 | Hu |
| 5,991,177 | A | 11/1999 | Kaczkowski |
| 6,028,754 | A | 2/2000 | Guzman |
| 6,256,592 | B1 | 7/2001 | Roberts |
| 6,341,055 | B1 | 1/2002 | Guzman-Casillas |
| 6,356,421 | B1 | 3/2002 | Guzman-Casillas |
| 6,392,390 | B1 | 5/2002 | Ito et al. |
| 6,456,947 | B1 | 9/2002 | Adamiak |
| 6,493,203 | B1 | 12/2002 | Ito et al. |
| 6,518,767 | B1 | 2/2003 | Roberts |
| 6,571,182 | B2 | 5/2003 | Adamiak |
| 6,590,397 | B2 | 7/2003 | Roberts |
| 6,798,211 | B1 | 9/2004 | Rockwell |
| 6,879,917 | B2 | 4/2005 | Turner |
| 6,919,717 | B2 | 7/2005 | Ghassemi |
| 7,095,139 | B2 | 8/2006 | Tsutada et al. |
| 7,345,863 | B2 | 3/2008 | Fischer |
| 7,425,778 | B2 | 9/2008 | Labuschagne |
| 7,469,190 | B2 | 12/2008 | Bickel |
| 7,472,026 | B2 | 12/2008 | Premerlani |
| 7,567,881 | B2 | 7/2009 | Kasztenny |
| 7,629,786 | B2 | 12/2009 | Lee |
| 7,696,648 | B2 | 4/2010 | Kinoshita et al. |
| 7,812,615 | B2 | 10/2010 | Gajic |
| 7,982,341 | B2 | 7/2011 | Kinoshita et al. |
| 8,008,810 | B2 | 8/2011 | Kinoshita et al. |
| 8,217,536 | B2 | 7/2012 | Koshizuka et al. |
| 8,289,668 | B2 | 10/2012 | Kasztenny |
| 8,553,379 | B2 | 10/2013 | Kasztenny |
| 8,564,159 | B2 | 10/2013 | Udagawa et al. |
| 8,750,008 | B2 | 6/2014 | Sugiyama et al. |
| 9,008,982 | B2* | 4/2015 | Tziouvaras ............ G01R 31/62 702/65 |
| 9,166,876 | B2* | 10/2015 | Fella, Jr. ................. H04L 43/08 |
| 9,459,291 | B2 | 10/2016 | Matsumoto |
| 9,714,957 | B2 | 7/2017 | Giovanelli |
| 2001/0012984 | A1 | 8/2001 | Adamiak |
| 2002/0101229 | A1 | 8/2002 | Roberts |
| 2003/0164714 | A1* | 9/2003 | Ghassemi ............. G01R 15/06 324/658 |
| 2005/0068792 | A1 | 3/2005 | Yasumura |
| 2006/0012374 | A1 | 1/2006 | Kojovic |
| 2007/0070565 | A1 | 3/2007 | Benmouyal |
| 2007/0290670 | A1 | 12/2007 | Lee |
| 2008/0077336 | A1 | 3/2008 | Fernandes |
| 2009/0059447 | A1 | 3/2009 | Gajic |
| 2009/0091867 | A1 | 4/2009 | Guzman-Casillas |
| 2009/0097173 | A1 | 4/2009 | Kinoshita et al. |
| 2010/0002348 | A1 | 1/2010 | Donolo |
| 2010/0039737 | A1 | 2/2010 | Koshizuka et al. |
| 2010/0085668 | A1 | 4/2010 | Kinoshita et al. |
| 2010/0141235 | A1 | 6/2010 | Koshiduka et al. |
| 2010/0217548 | A1 | 8/2010 | Faybisovich |
| 2011/0080053 | A1 | 4/2011 | Urano |
| 2013/0155553 | A1 | 6/2013 | Kawasaki et al. |
| 2013/0176021 | A1 | 7/2013 | Udagawa et al. |
| 2014/0104738 | A1* | 4/2014 | Schweitzer, III ........ H02H 3/08 361/87 |
| 2015/0081234 | A1* | 3/2015 | Schweitzer, III .... G01R 31/088 702/58 |
| 2016/0077149 | A1 | 3/2016 | Schweitzer, III |
| 2016/0241336 | A1 | 8/2016 | Kasztenny |
| 2017/0082675 | A1 | 3/2017 | Schweitzer, III et al. |
| 2017/0110875 | A1 | 4/2017 | Schweitzer, III et al. |
| 2019/0044325 | A1* | 2/2019 | Wilson ................... H04L 43/08 |
| 2019/0195918 | A1 | 6/2019 | Schweitzer, III |

FOREIGN PATENT DOCUMENTS

| | | |
|---|---|---|
| CN | 104297643 | 1/2015 |
| CN | 204203409 | 3/2015 |
| CN | 104730419 | 6/2015 |
| CN | 204439784 | 7/2015 |
| CN | 103454517 | 5/2016 |
| CN | 103364604 | 6/2016 |
| CN | 106019081 | 10/2016 |
| CN | 103604991 | 3/2017 |
| CN | 106597349 | 4/2017 |
| CN | 106772200 | 5/2017 |
| CN | 106771645 | 6/2019 |
| EP | 1074849 | 2/2001 |
| WO | 2009081215 | 7/2009 |
| WO | 2017125145 | 7/2017 |

OTHER PUBLICATIONS

F. Ghassemi; P. Gale; T. Cumming; C. Coutts; "Harmonic voltage measurements using CVTs"; Feb. 14, 2005; IEEE; pp. 443-449 (Year: 2005).*

Davarpanah, Mahdi, Majid Sanaye-Pasand, and Firouz Badrkhani Ajaei "CCVT failure due to improper design of auxiliary voltage transformers." IEEE transactions on power delivery 27.1 (2011): 391-400.

Edmund O. SCHWEITZER and Bogdan Kasztenny. "Distance protection: Why have we started with a circle, does it matter, and what else is out there?." 2018 71st Annual Conference for Protective Relay Engineers (CPRE). IEEE, 2018.

Yamada, Takahiro, et al. "Development of simple coupling-capacitor voltage transformer for GIS." 2001 IEEE Power Engineering Society Winter Meeting. Conference Proceedings (Cat. No. 01CH37194). vol. 1. IEEE, 2001.

Bogdan Kasztenny, et al. "Distance relays and capacitive voltage transformers-balancing speed and transient overreach." 53rd Annual Conference for Protective Relay Engineers. 2000.

Kezunovic, M., and J. Ren. "New test methodology for evaluating protective relay security and dependability." 2008 IEEE Power and Energy Society General Meeting-Conversion and Delivery of Electrical Energy in the 21st Century. IEEE, 2008.

Ghassemi, Foroozan, et al. "Harmonic voltage measurements using CVTs." IEEE Transactions on Power Delivery 20.1 (2005): 443-449.

(56) References Cited

OTHER PUBLICATIONS

Vermeulen, H. J., and P. Davel. "Voltage harmonic distortion measurements using capacitive voltage transformers." Proceedings of IEEE AFRICON'96. vol. 2. IEEE, 1996.
Zhao, Sen Peng. Design and Implementation of a Frequency Response Test System for Instrument Voltage Transformer Performance Studies. Diss. The University of Manchester (United Kingdom), 2013.
Zhao, S., et al. "Impact of power quality sensor technique on power system protection voltage transient measurements." (2010): 70-70.
Lee, Harry, and Abdul M. Mousa. "GPS travelling wave fault locator systems: investigation into the anomalous measurements related to lightning strikes." IEEE Transactions on Power Delivery 11.3 (1996): 1214-1223.
Xiangjun, Zeng, et al. "Fault location using traveling wave for power networks." Conference Record of the 2004 IEEE Industry Applications Conference, 2004. 39th IAS Annual Meeting.. vol. 4. IEEE, 2004.
Xiangjun, Zeng, et al. "The sensor of traveling-wave for fault location in power systems." 2004 International Conference on Power System Technology, 2004. PowerCon 2004.. vol. 2. IEEE, 2004.
Elhaffar, A., and M. Lehtonen. "An improved GPS current traveling-wave fault locator in EHV transmission networks using few recordings." 2005 International Conference on Future Power Systems. IEEE, 2005.
Li, Zewen, et al. "Theoretical modeling and implementation of traveling wave sensor based on PCB coils." Journal of Sensors 2015 (2015).
Xianghui, Chu, et al. "Rogowski sensor for power grid traveling wave based fault location." (2008): 438-443.
Che, Kai, et al. "Testing system of voltage traveling wave fault location technique." 2017 IEEE Conference on Energy Internet and Energy System Integration (EI2). IEEE, 2017.
Nan, Chen, et al. "Software for power grid fault location with traveling-wave." 2006 International Conference on Power System Technology. IEEE, 2006.
Liang, Shun, Qiaohui Hu, and Wei-Jen Lee. "CCVT calibration for harmonic voltage measurement by digital simulation and field test." 41st North American Power Symposium. IEEE, 2009.
BVM Systems Limited. "PQ-SensorTM Broadband Voltage Transducer—The only practical solution for accurate monitoring of transmission network transients and harmonics." http://www.bvmsystems.co.uk/Downloads files/PQSensor 1.0 A4.pdf. Accessed: Jan. 22, 2020. 2009.
ABB High Voltage Products. PQ-SensorTM . http://www.pqs-consulting.com/brochure-abb-1 hsm_9543_42-20en_pqsensor_technical_information.pdf. Accessed: Jan. 22, 2020.
ABB High Voltage Products. Oil Insulated Outdoor Instrument Transformers Buyer's Guide. https://library.e.abb.com/public/fce7ba9deb689703c1257a85003daa2a/Buyers%20Guide%20Oil%20Insulated%20Outdoor%20Instrument%20Transformers%20Ed%207%20en.pdf. Accessed: Jan. 22, 2020.
Trench. Master of Waves. https://w5.siemens.com/italy/web/pw/press/newsletterenergy/Documents/Trench Italia.pdf. Accessed: Aug. 12, 2018. 2014.
Ritz Instrument Transformers. PQ-SensorTM Power Quality Sensor for use with capacitor voltage transformers, http://www.pqsconsulting.com/ritzbrochure.pdf. Accessed: Jan. 22, 2020.
BVM Systems Limited. PQ-SensorTM MkIII Installation and Commissioning Manual. http://www.bvmsystems.co.uk/Downloads_files/PQSensor%20MkIII%20Installation_40-0287-03.pdf. Accessed: Jan. 22, 2020. 2010.
BVM Systems Limited. PQ-SensorTM Delivering Precision Wideband Power Quality, Harmonic and Transient Measurements Using CVTs www.bvmsystems.co.uk/Home.html. Accessed: Jan. 22, 2020. 2010.
Arteche. Power Quality Measurement with Capacitor Voltage Transformers. https://www.arteche.com/es/cmis/browser?id=workspace://SpacesStore/2ead4750-bcea-4d6b-ba57-113b5fa15e90&entityid=4402. Accessed: Jan. 22, 2020. 2013.
50Hz Solutions Pty Ltd. Corporate Profile. http://50hzsolutions.com.au/wp-content/uploads/2015/02/50HzSolutions-CorporateProfile.pdf. Accessed: Jan. 22, 2020. 2014.
BVM Systems Limited. Harmonic Measurements on Transmission Networks (application note). http://www.bvmsystems.co.uk/Downloads_files/Harmonic%20Measurements%20in%20Transmission%20Substations.pdf. Accessed: Jan. 22, 2020. 2010.
Costello, David and Zimmerman Karl: "CVT Transients Revisited—Distance, Directional Overcurrent, and Communications-Assisted Tripping Concerns" 65th Annual Conference for Protective Relay Engineers Apr. 2012.
Cao, Xiang; Thorp, James S.; Hou, Daqing: "Case Studies: Designing Protection Systems That Minimize Potential Hidden Failures" 39th Annual Western Protective Relay Conference, Oct. 2012.
Gray, Sophie; Haas, Derrick; Mcdaniel, Ryan: "CCVT Failures and Their Effects on Distance Relays" 71st Annual Conference for Protective Relay Engieers, Mar. 2018.
Kasztenny, Bogdan; Stevens, Ian: "Monitoring Ageing CCVTs Practical Solutions with Modern Relays to Avoid Catastrophic Failures" Nov. 2006.
Transformers Magazine: "Diagnostic Measurements on Instrument Transformers—Part I, A Classificatino and Overview of Diagnostic Measurements" Oct. 3, 2016.
Vastano, Mark: "NERC Lessons Learned" Apr. 23, 2015.

* cited by examiner

CAPACITANCE-COUPLED VOLTAGE TRANSFORMER MONITORING

RELATED APPLICATION (none)

TECHNICAL FIELD

This disclosure relates to monitoring the operation of a capacitance-coupled voltage transformer (CCVT or CVT). In particular, this disclosure relates to obtaining primary and secondary signals from a CCVT and monitoring performance of the CCVT using the primary and secondary signals.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Electric power delivery systems are expected to operate reliably, safely, and economically. To meet those objectives, systems are closely monitored to determine operating conditions, detect anomalies, and effect protective actions on the electric power delivery system. Monitoring typically involves obtaining current and voltage measurements from various pieces of equipment of the electric power delivery system and using the current and voltage measurements in various monitoring and protection functions. Portions of the electric power delivery system may be operated at a sufficiently high voltage that a capacitively-coupled voltage transformer (CCVT) is used to obtain voltage measurements.

CCVTs are used to reduce high-voltage signals to a low voltage for monitoring by an intelligent electronic device (IED). Over time, CCVT components may degrade, resulting in errors in the measured voltage, failure of the CCVT, or even catastrophic events such as CCVT explosion. Errors in the measured voltage may result in misoperation of the IED. Catastrophic events may lead to injury or system failure. What is needed is a system to monitor CCVT for component degradation such that the CCVT may be repaired or replaced before significant misoperation or a catastrophic event occurs.

Most methods of CCVT monitoring require knowledge of the power system behavior or analysis of CCVT transients. These methods are sometimes complex because data about the CCVT health must be extracted from the CCVT secondary voltage and/or other power system equipment such as CCVTs on other phases. Time-domain and frequency-domain characteristics of CCVT secondary voltages are highly complex. Traditional CCVT monitoring techniques suffer from the resulting complexity. Furthermore, single-phase CCVTs are often not monitored because of the difficulty in obtaining a reliable reference quantity. What is needed is a system for monitoring a single-phase CCVT without requiring knowledge of the power system behavior or analysis of CCVT transients.

Accordingly, disclosed herein are improvements to IEDs that use signals from CCVTs to monitor the CCVT itself for component degradation. In various embodiments, the IED may perform monitoring functions on the electric power delivery system and monitoring functions on the CCVT.

Figure 1:
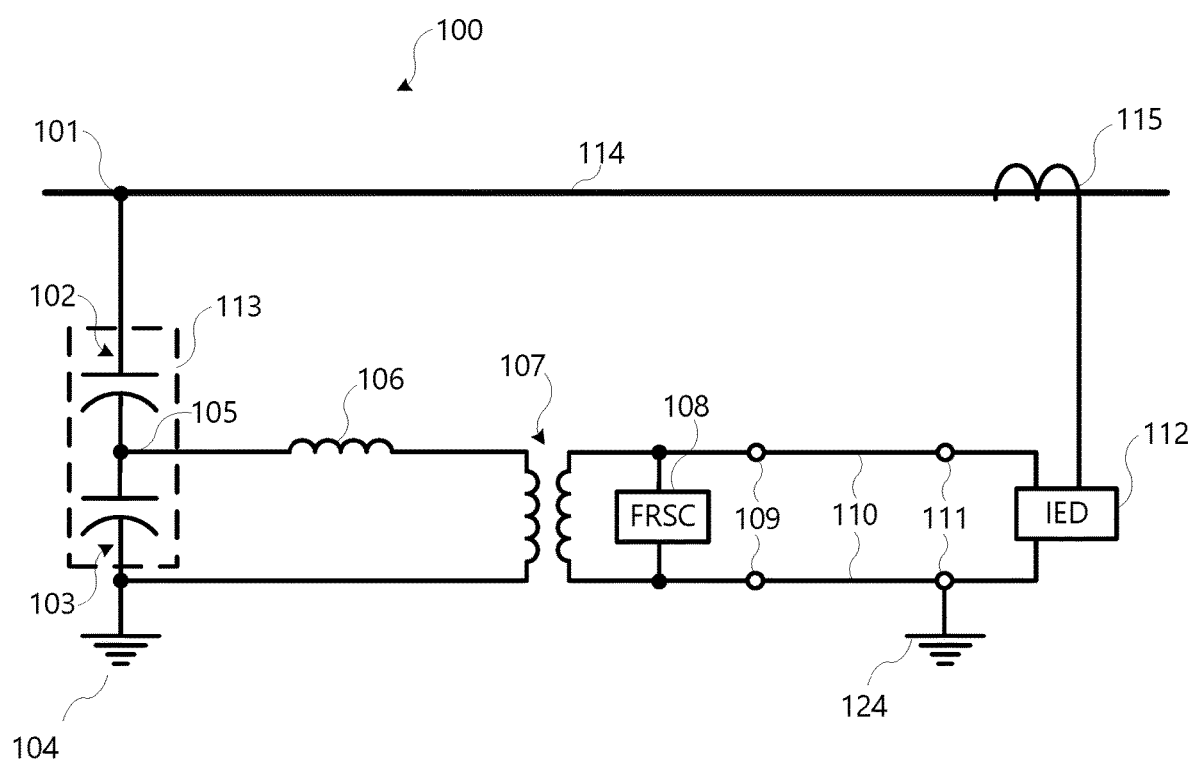
FIG. 1 illustrates a simplified diagram of a system including a CCVT and an intelligent electronic device (IED) consistent with the present disclosure.

FIG. 1 illustrates a simplified diagram of a system 100 including a CCVT consistent with the present disclosure. A capacitor stack 113 is in electrical communication with a high voltage portion 102 and a low voltage portion 103 and is connected between a primary voltage terminal 101 and a substation ground 104. A primary current measurement device 115 may be used to obtain current measurements from a line such as a transmission or distribution line, bus, or the like.

The capacitor stack 113 creates a capacitive voltage divider and produces an intermediate voltage at the tap terminal 105. In various embodiments, the primary voltage may be 110 kV and above, and may include 750 kV and 1 MV networks. The intermediate voltage may be in the range of 5-30 kV. A step-down transformer 107 further steps down the intermediate voltage to a standard secondary voltage at the output CCVT terminals 109. The standard secondary voltage may be in the range of 60-250 V in various embodiments.

A direct connection of a step-down transformer to a capacitor stack may introduce an angle measurement error. To reduce that error, a tuning reactor 106 may be connected in series between the intermediate voltage terminal 105 in the capacitive divider and the step-down transformer 107. A connection of the step-down transformer 107 and the capacitors 102 and 103 would create a danger of ferroresonance. A ferroresonance is a self-exciting and potentially destructive oscillation between the non-linear magnetizing branch of the step-down transformer 107 and the capacitors 102 and 103. A ferroresonance suppression circuit (FRSC) 108 is connected to the secondary winding of the step-down transformer 107 to prevent ferroresonance. The output voltage at the CCVT secondary terminals 109 is connected via control cables 110 to the input terminals 111 of the end device 112 such as an IED. The connection at the end device 112 typically includes a safety ground 124.

System 100 acts inadvertently as a band-pass filter. System 100 passes the fundamental frequency component (typically 50 or 60 Hz) at the nominal transformation ratio and with small magnitude and angle errors. The components of system 100 considerably attenuate frequencies below the nominal power system frequency as well as high frequencies. In addition, the CCVT produces transient components in the spectrum close to the nominal frequency that may impair the operation of the power system monitoring as mentioned above.

For very high frequency components, such as voltage traveling waves, an ideal tuning reactor 106 behaves as an open circuit, and therefore it does not pass any very high frequency signals to the step-down transformer 107. Similarly, an ideal step-down transformer 107 is an open circuit for very high frequencies, and as such, it also prevents any high-frequency signals from being passed to the low voltage side 109 of the step-down transformer 107. As a result, the IED 112 may not receive high-frequency signals, such as may be associated with traveling waves at its terminals 111. In practice, however, the tuning reactor 106 has some parasitic inter-turn capacitance, which may also be called stray capacity. Similarly, the windings of the step-down transformer 107 also include parasitic capacitance.

Various embodiments consistent with the present disclosure may use measurements from the electric power delivery system such as measurements from primary current measurement device 115 along with additional measurements associated with capacitor stack 113 to monitor performance of the CCVT. Such systems and methods may also use signals obtained from the CCVT and CT 115 to monitor and protect a larger electric power delivery system. For the purposes of the present disclosure, additional current measurements from the capacitor stack 113 may be used to monitor the CCVT for degradation. For various implementations, a second CT may be used. For example, to obtain high-fidelity voltage signals, a second CT may be used to obtain a second current signal. The second CT may also be useful for monitoring and protection of the CCVT according to several embodiments described herein.

Figure 2A:
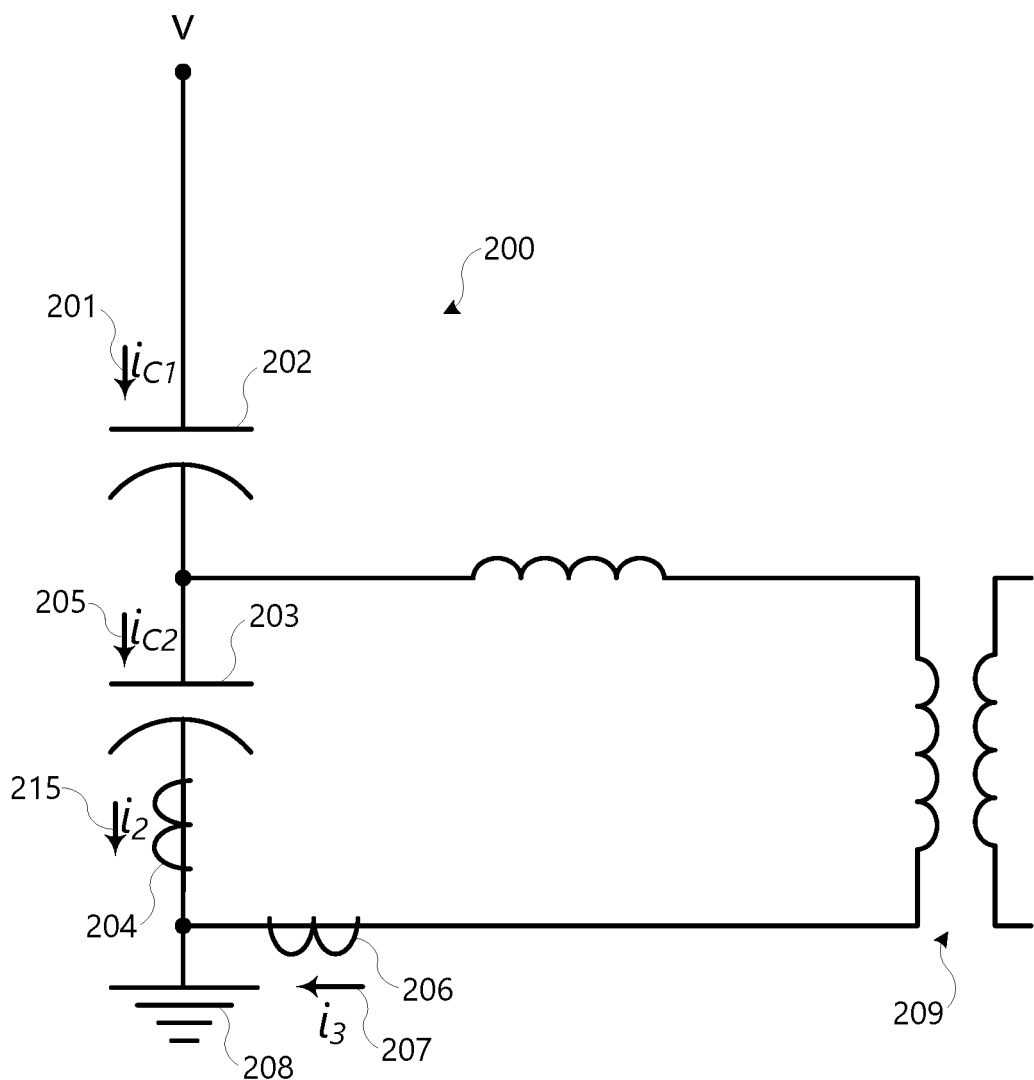
FIG. 2A illustrates a simplified diagram of a system to obtain measurements for monitoring of a CCVT consistent with embodiments of the present disclosure.

FIG. 2A illustrates a simplified diagram of a system 200 to determine a voltage signal based on current measurements in a CCVT consistent with embodiments of the present disclosure. The current signals may be used to monitor the CCVT. In the illustrated embodiment, a first current transformer 204 is installed in series with the low voltage capacitor 203 in a CCVT. A second current transformer 206 is located in the return connection from a step-down transformer 209. The current transformers 204 and 206 may be installed near the ground 208 for various reasons, including the low electrical potential and the accessibility of the wires. One or both of current transformers 204 and 206 may be embodied as a clamp-on transformer or other current measurement device in various embodiments.

Using Kirchoff's current law, the current $i_{C1}$ 201 through capacitor 202 may be expressed as a function of the currents through the current transformers 204 and 206, as shown in Eq. 1.

$$i_{C1} = i_2 + i_3 \qquad \text{Eq. 1}$$

The current $i_{C2}$ 205 through capacitor 203 is measured directly by current transformer 204, as it is equal to $i_2$ 215. Having the currents $i_{C1}$ 201 and $i_{C2}$ 205 in capacitors 202 and 203, the voltage may be calculated using Eq. 2.

$$v = \frac{1}{C_1} \int i_{C1} dt + \frac{1}{C_2} \int i_{C2} dt \qquad \text{Eq. 2}$$

Eq. 2 provides an accurate representation of the voltage in a wide frequency range. While Eq. 2 represents an ideal voltage calculation, it is understood that Eq. 2 may be modified to apply to only certain frequency ranges. For example, if calculation of only high-frequency voltages is required, the integration in Eq. 2 may be implemented on only high-frequencies by means of a digital or analog low-pass filter, as a non-limiting example.

Figure 2B:
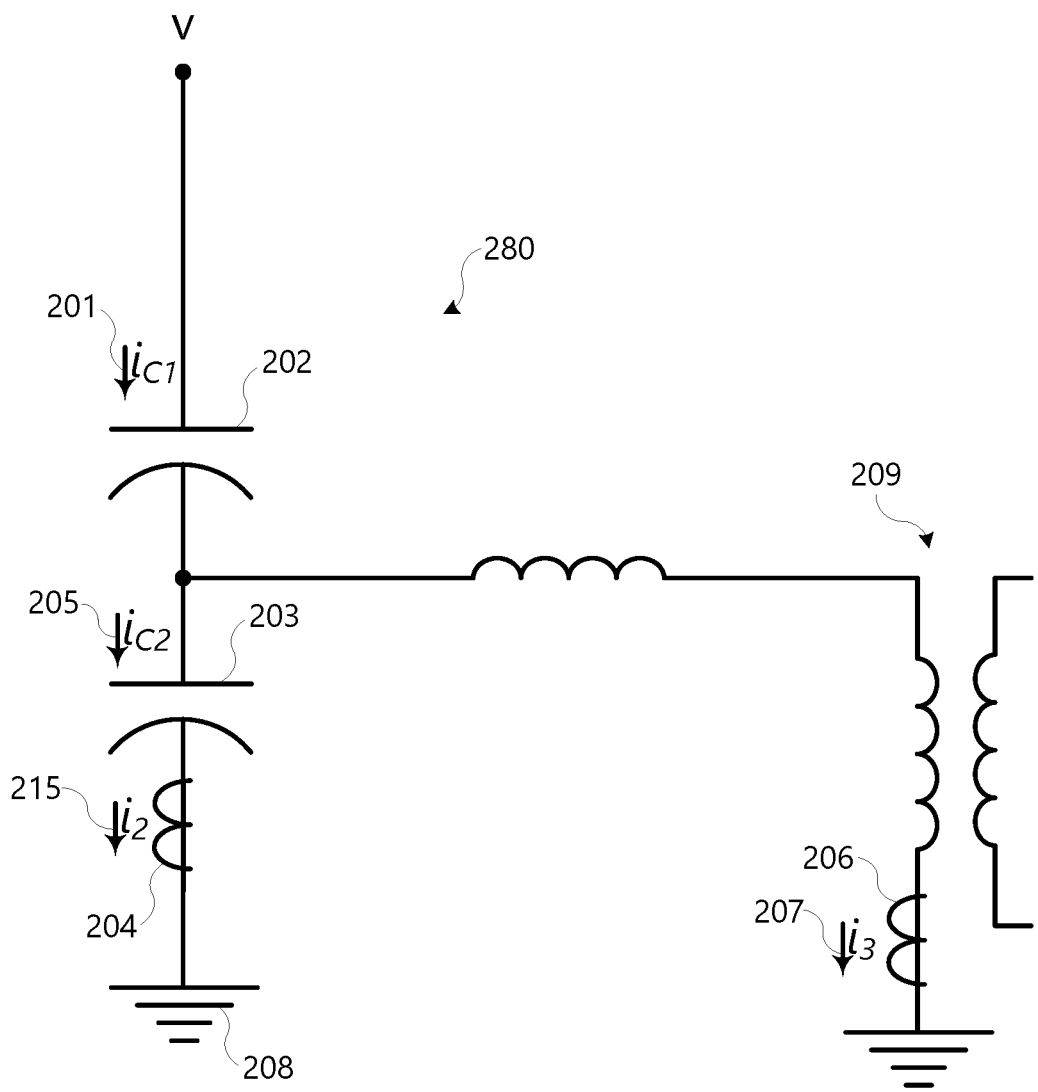
FIG. 2B illustrates a simplified diagram of a system to obtain measurements for monitoring of a CCVT consistent with embodiments of the present disclosure.

FIG. 2B illustrates a simplified diagram of a system 280 to determine a voltage signal based on current measurements in a CCVT consistent with embodiments of the present disclosure. In contrast to system 200 illustrated in FIG. 2A, system 280 has a different grounding configuration.

Figure 2C:
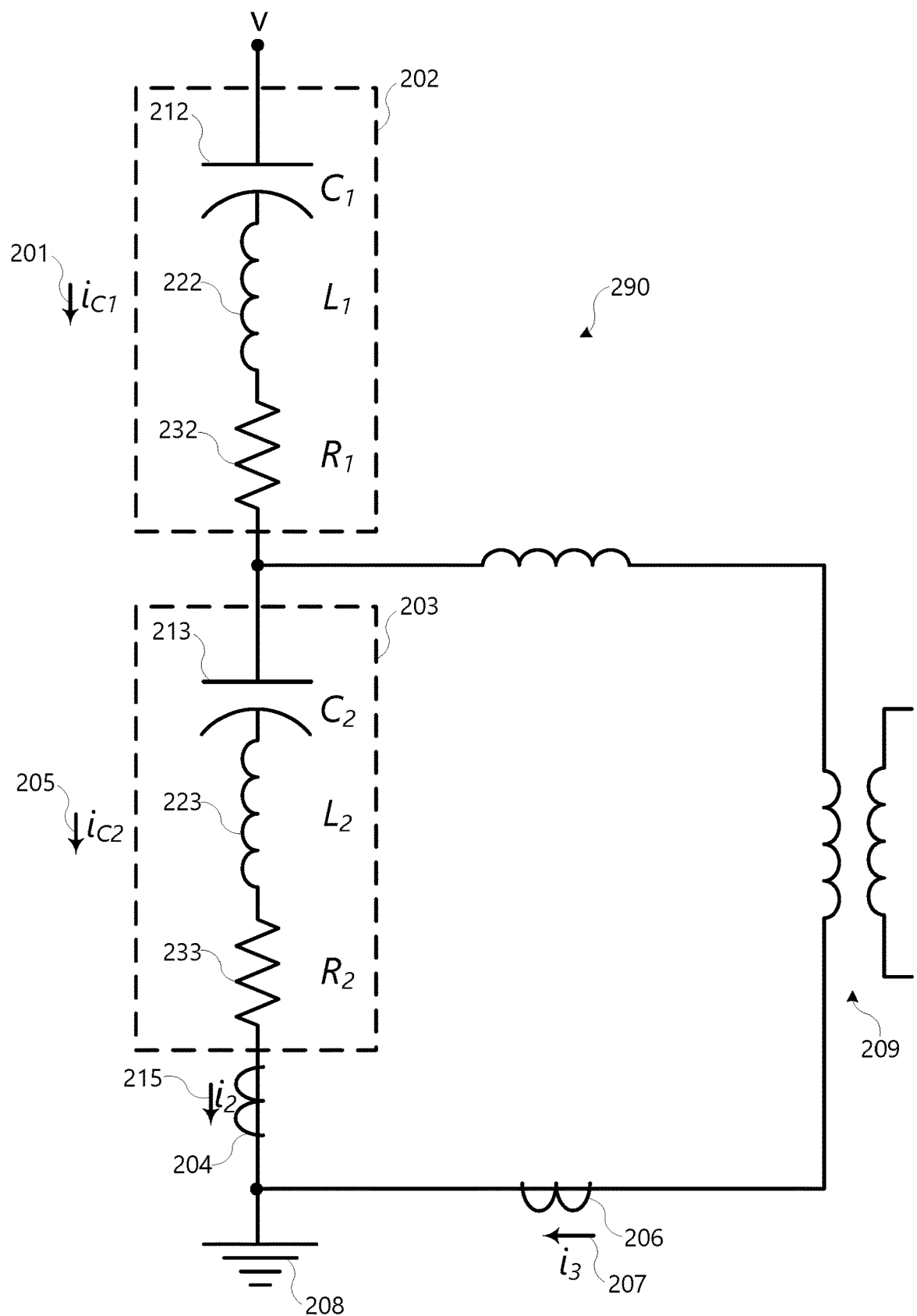
FIG. 2C illustrates a simplified diagram of a system to obtain measurements for monitoring of a CCVT consistent with embodiments of the present disclosure.

FIG. 2C illustrates a simplified diagram of a system 290 to determine a voltage signal based on current measurements in a CCVT consistent with embodiments of the present disclosure. In contrast to system 200 illustrated in FIG. 2A, the capacitors 202 and 203 are shown with equivalent series resistances R1 232 and R2 233 and equivalent series inductances L1 222 and L2 223. In some embodiments, Eq. 2 may not be valid over a frequency range of interest, and integration of currents through ideal capacitors C1 212 and C2 213 may not be an accurate representation of the voltage across the capacitors. Accordingly, a more accurate model of the CCVT may be employed such as illustrated in FIG. 2C. The voltage may be calculated as shown in Eq. 3.

$$v = \left[ L_1 \frac{di_{C1}}{dt} + R_1 i_{C1} + \frac{1}{C_1} \int i_{C1} dt \right] + \left[ L_2 \frac{di_{C2}}{dt} + R_2 i_{C2} + \frac{1}{C_2} \int i_{C2} dt \right] \qquad \text{Eq. 3}$$

Although FIG. 2C illustrates a particular embodiment of a system to determine a voltage signal based on current measurements in a CCVT, different embodiments are contemplated. For example, instead of modeling the CCVT capacitors as a series R-L-C circuit, other models may be used which may employ any number of elements in any configuration.

Figure 3:
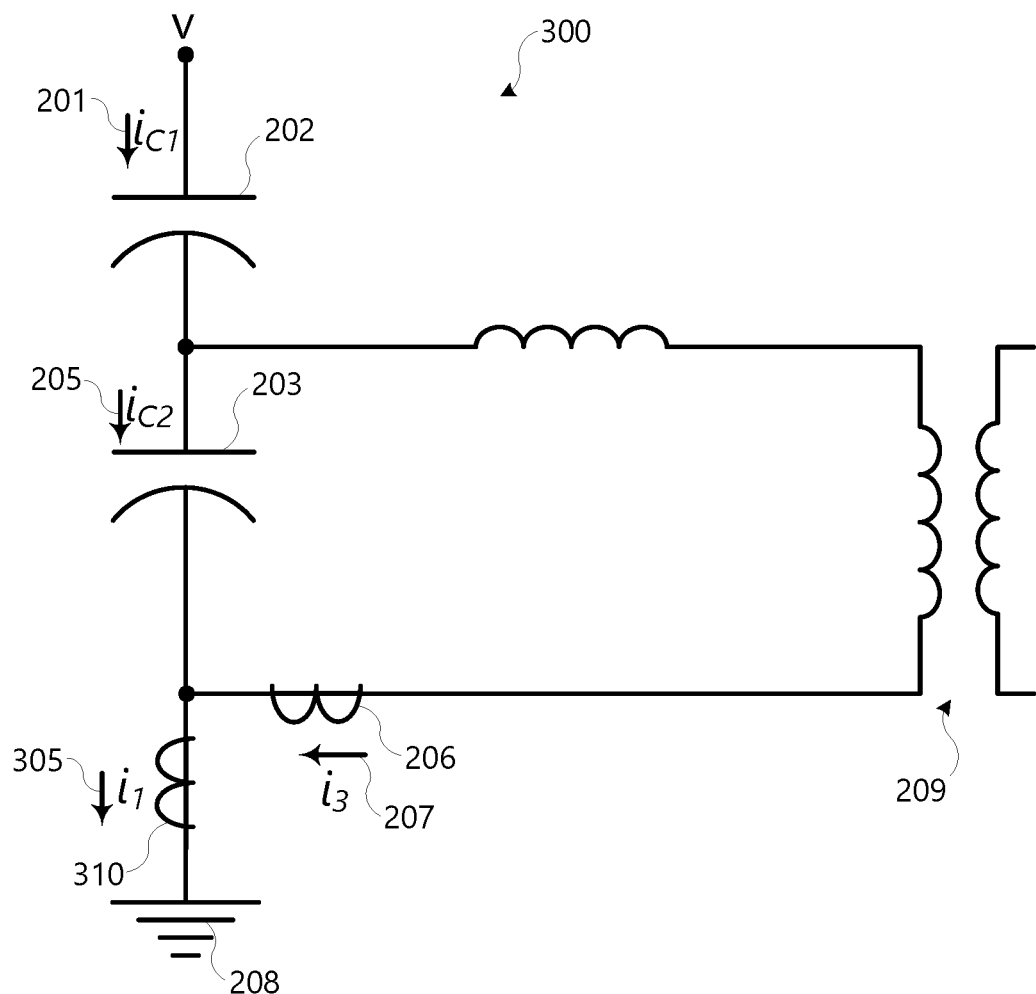
FIG. 3 illustrates a simplified diagram of a system to obtain measurements for monitoring of a CCVT consistent with embodiments of the present disclosure.

FIG. 3 illustrates a simplified diagram of a system 300 to determine a voltage signal based on a current measurement in a CCVT consistent with embodiments of the present disclosure. In contrast to system 200 illustrated in FIG. 2A, system 300 illustrated in FIG. 3 has the first current transformer 310 installed in the ground connection rather than in the low portion of the capacitor stack.

Using Kirchoff's current law, the current $i_{C1}$ 201 through capacitor 202 may be expressed as a function of the current through transformer 310, as shown in Eq. 4.

$$i_{C1} = i_1 \quad \text{Eq. 4}$$

The current through capacitor 203 may be expressed using Eq. 5.

$$i_{C2} = i_1 - i_3 \quad \text{Eq. 5}$$

Equation 5 may be used with Equation 4 and Equation 2 to determine a voltage signal for use in connection with the systems and methods disclosed herein.

Figure 4A:
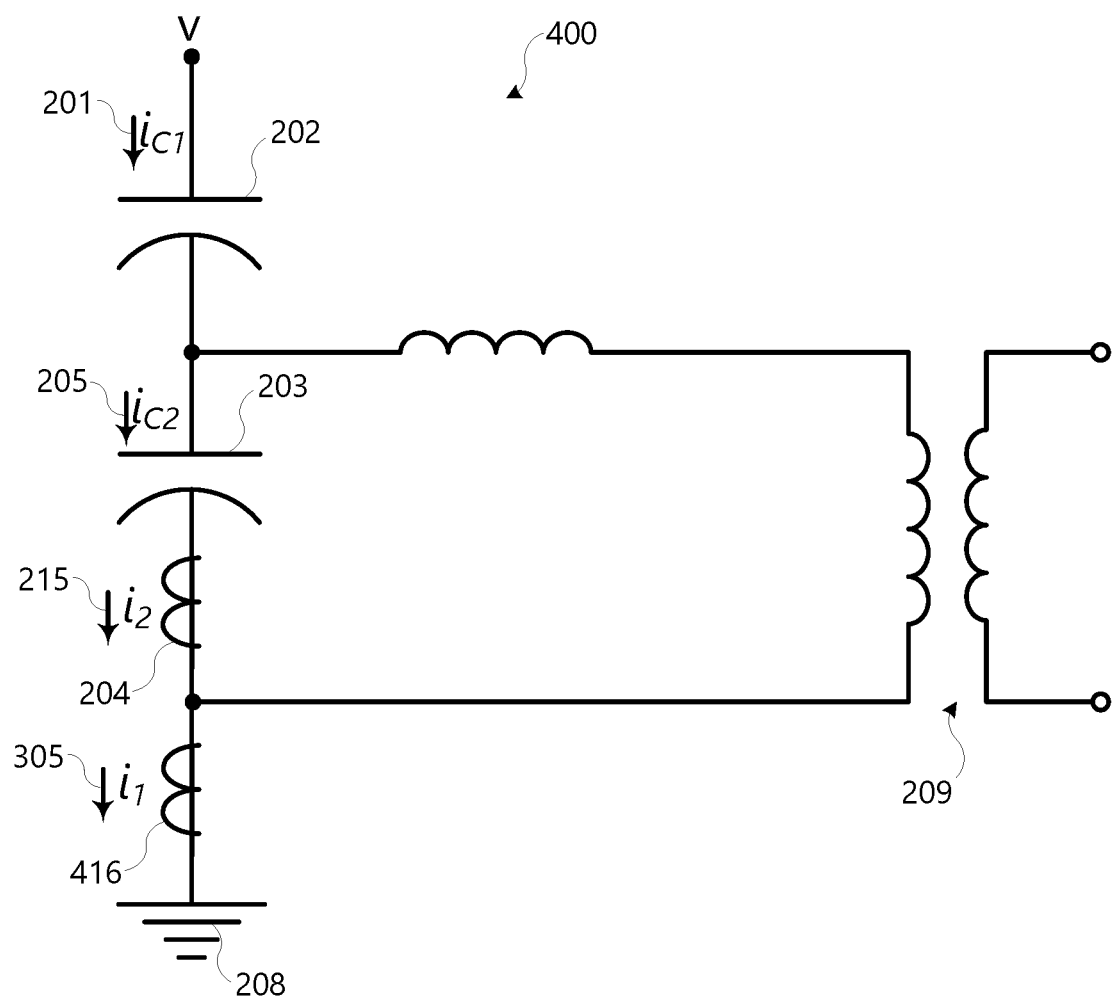
FIG. 4A illustrates a simplified diagram of a system to obtain measurements for monitoring of a CCVT consistent with embodiments of the present disclosure.

FIG. 4A illustrates a simplified diagram of a system 400 to determine a voltage signal based on a current measurement in a CCVT and to obtain measurements useful to monitor CCVT health consistent with embodiments of the present disclosure. In comparison to system 200 illustrated in FIG. 2A, system 400 has a different grounding configuration.

Using Kirchoff's current law, the current $i_{C1}$ 201 through capacitor 202 may be expressed as a function of the current through transformer 416, as shown in Equation 6.

$$i_{C1} = i_1 \quad \text{Eq. 6}$$

The current through capacitor 203 $i_{C2}$ 205 may be expressed using Equation 7.

$$i_{C2} = i_2 \quad \text{Eq. 7}$$

Equations 6, 7, and 2 may be used to determine a voltage signal from the current signals determined by current transformers 204 and 416. In connection with the systems illustrated in FIGS. 2A, 2B, 2C, 3, 4A, 4B, 4C, 8, 9, 10 and 11, other current measurement devices, such as current transformers, resistive shunts, or capacitive shunts may be utilized. Such currents may be used to monitor health of a CCVT.

Figure 4B:
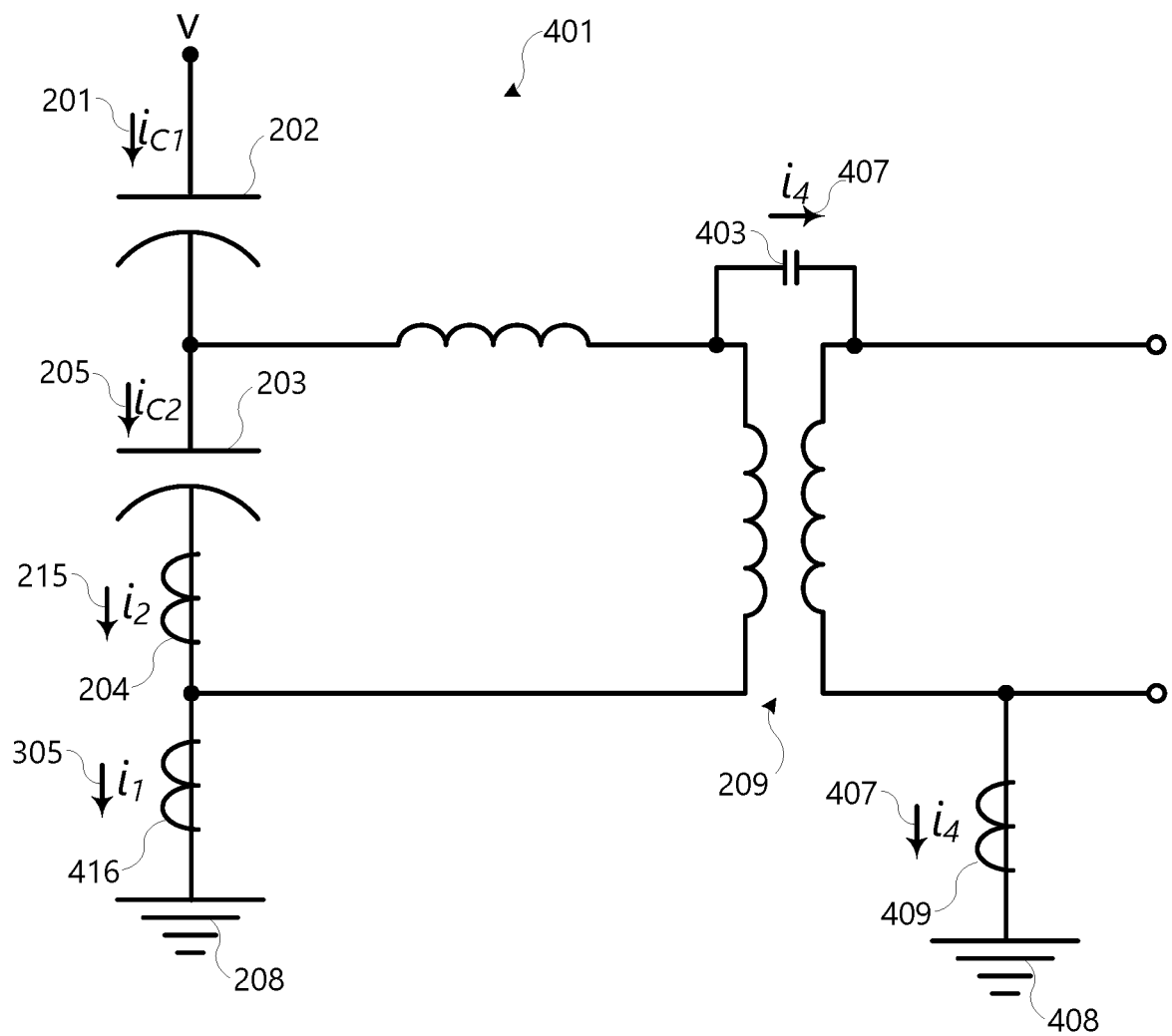
FIG. 4B illustrates a simplified diagram of a system to obtain measurements for monitoring of a CCVT consistent with embodiments of the present disclosure.

FIG. 4B illustrates a simplified diagram of a system 401 to determine a voltage signal based on a current measurement in a CCVT and to obtain measurements useful to monitor CCVT health consistent with embodiments of the present disclosure. In comparison to FIG. 4A, the system 401 illustrates parasitic capacitance 403 which conducts current $i_4$ 407. The parasitic current is measured using current transformer 409. Using Kirchoff's current law, the current through capacitor 202 $i_{C1}$ may be expressed as a function of the current through transformers 206 and 409, as shown in Equation 8.

$$i_{C1} = i_1 + i_4 \quad \text{Eq. 8}$$

While FIG. 4B illustrates a parasitic capacitance of the step-down transformer 209, it is understood that other parasitic current paths may exist and can be measured to improve the calculation of current through the CCVT capacitors 202 and 203. Alternatively, some CCVTs may have internal ground connections or other non-parasitic components which operate as current paths to ground. Measurement of other currents and voltages in the CCVT may be required to accurately calculate a current through a capacitor element of the capacitor stack. Furthermore, some current paths may be predictable, and their effects on the current in the capacitor stack may be calculated or estimated indirectly rather than measured.

Figure 4C:
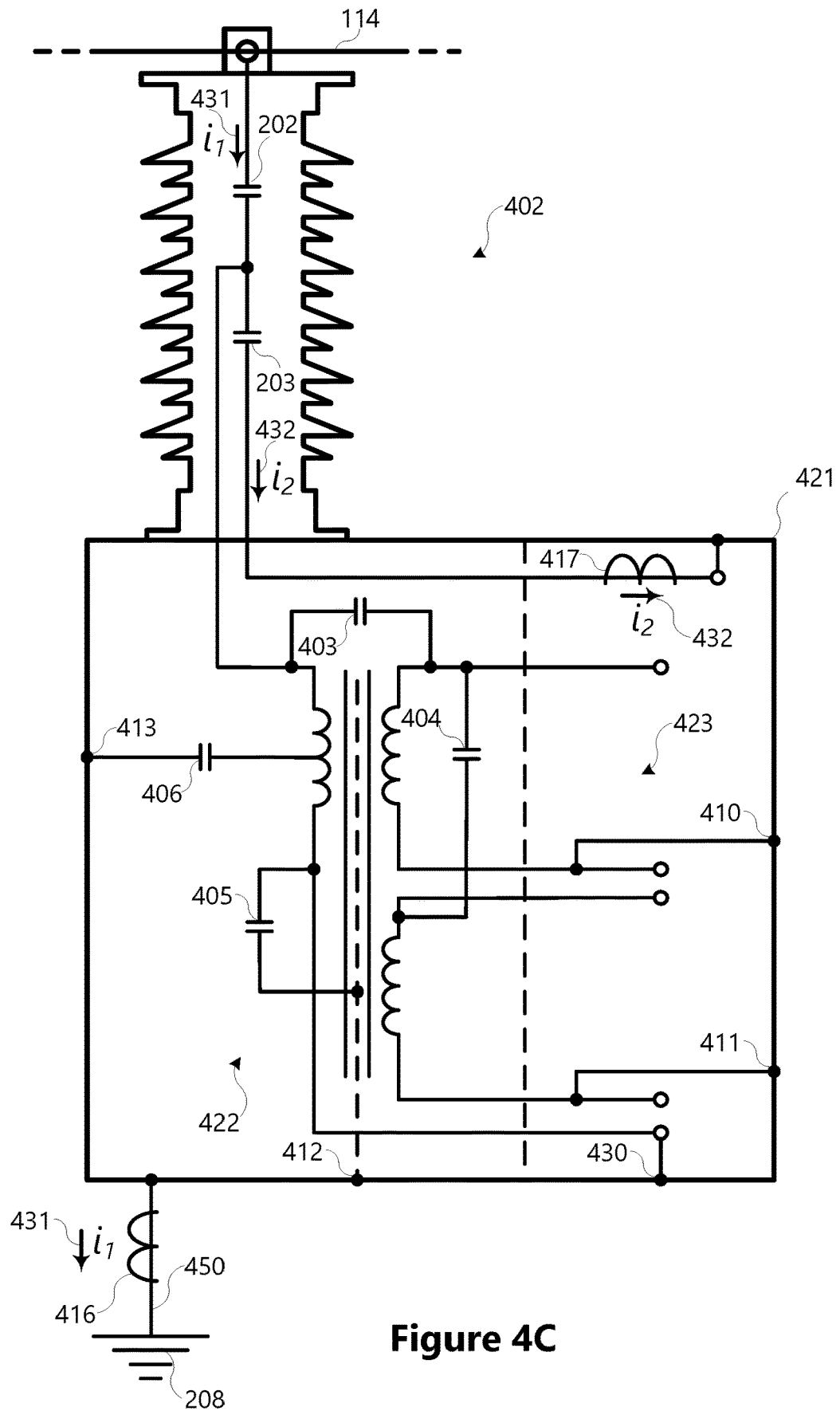
FIG. 4C illustrates a simplified diagram of a system to obtain measurements for monitoring of a CCVT consistent with embodiments of the present disclosure.

FIG. 4C illustrates a diagram of a system 402 to determine a voltage signal based on a current measurement in a CCVT and to obtain measurements useful to monitor CCVT health consistent with embodiments of the present disclosure. In comparison to FIG. 4B, the system 402 illustrates parasitic capacitances 403, 404, 405, and 406 which collectively conduct current from capacitor 202 to CCVT secondary terminal box 421. Furthermore, several non-parasitic connections 410, 411, and 412 conduct current from capacitor 202. The CCVT secondary terminal box 421 may be divided into accessible region 423 and inaccessible region 422. Accordingly, it may be difficult to measure the effects of current paths in the inaccessible region 422 such as current through chassis connections 412 and 413. The CCVT secondary terminal box 421 is connected to ground 208 through an external ground lead 450. In this embodiment, current transformer 416 measures current $i_1$ 431 through the ground lead 450. This allows the currents through all parasitic and non-parasitic chassis connections 410, 411, 430, 412, and 413 to be measured and used to accurately calculate the current $i_1$ 431 through capacitor 202.

Using Kirchoff's current law, the current through capacitor 202 $i_{C1}$ may be expressed as a function of the current through transformer 416, as shown in Equation 9.

$$i_{C1} = i_1 \quad \text{Eq. 9}$$

The current through capacitor 203 $i_{C2}$ 205 may be expressed as the current through transformer 417 using Equation 10.

$$i_{C2} = i_2 \quad \text{Eq. 10}$$

Equations 9, 10, and 2 may be used to determine a voltage signal from the current signals determined by current transformers 416 and 417.

Figure 5:
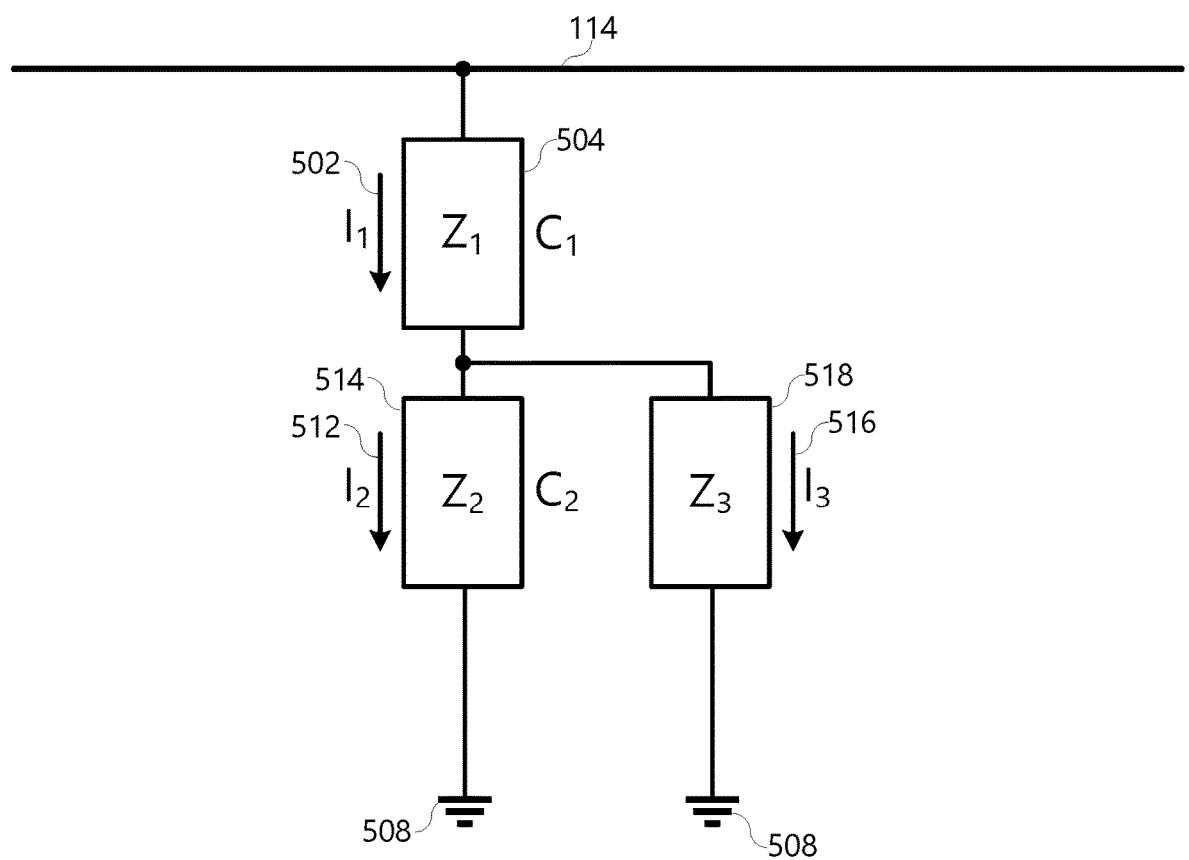
FIG. 5 illustrates a theoretical block diagram of electrical measurements useful for monitoring of a CCVT consistent with embodiments of the present disclosure.

FIG. 5 illustrates a representative circuit of a CCVT useful to illustrate monitoring a CCVT using current signals therefrom in accordance with several embodiments. A CCVT may be modeled in the frequency domain as a current divider with frequency-dependent impedances $Z_1$ 504, $Z_2$ 514, and $Z_3$ 518. Currents to ground 508 through leads may be different, depending on the frequency content of the signal. However, at a single frequency, the impedances $Z_1$ 504, $Z_2$ 514, and $Z_3$ 518 will remain constant under ideal conditions. Accordingly, changes in the relative impedances at a single frequency or frequency range may indicate degradation of the components of the CCVT.

The current through $C_2$ (represented by $I_2$ 512 in FIG. 5) may be calculated using Equation 11:

$$I_2 = I_1\left(\frac{Z_2 \| Z_3}{Z_2}\right) = I_1\left(\frac{Z_3}{Z_2 + Z_3}\right) \quad \text{Eq. 11}$$

where $I_1$ represents current through $C_1$. Similarly, the current $I_3$ 516 through the current transformer 206 (or through impedance $Z_3$ 518) may be calculated using Equation 12:

$$I_3 = I_1\left(\frac{Z_2 \| Z_3}{Z_3}\right) = I_1\left(\frac{Z_2}{Z_2 + Z_3}\right) \quad \text{Eq. 12}$$

Finally, the ratio of current $I_2$ to $I_3$ may be calculated using Equation 13:

$$\frac{I_2}{I_3} = \frac{I_1\left(\frac{Z_2 \| Z_3}{Z_2}\right)}{I_1\left(\frac{Z_2 \| Z_3}{Z_3}\right)} = \frac{I_1\left(\frac{Z_3}{Z_2 + Z_3}\right)}{I_1\left(\frac{Z_2}{Z_2 + Z_3}\right)} = \frac{Z_3}{Z_2} \quad \text{Eq. 13}$$

Impedances $Z_3$ and $Z_2$ are not constant over a range of frequencies, but at any given frequency, the impedances $Z_3$ and $Z_2$ are constant. As can be seen from Equation 13, measuring the currents $I_2$ and $I_3$ may be useful to determine a ratio of impedances $Z_3$ and $Z_2$. The ratio of the impedances $Z_3$ and $Z_2$ at a single frequency remains constant unless the health of the CCVT changes. Accordingly, the currents $I_2$ and $I_3$ at a single frequency or frequency range may be measured, and the ratio of $I_2$ to $I_3$ may be monitored. If the ratio changes, it may be an indication of a change in the capacitor stack or step-down transformer 209. In particular, a change or drift of the ratio of currents $I_2$ to $I_3$ outside of an acceptable band may indicate degradation of the CCVT.

Figure 6:
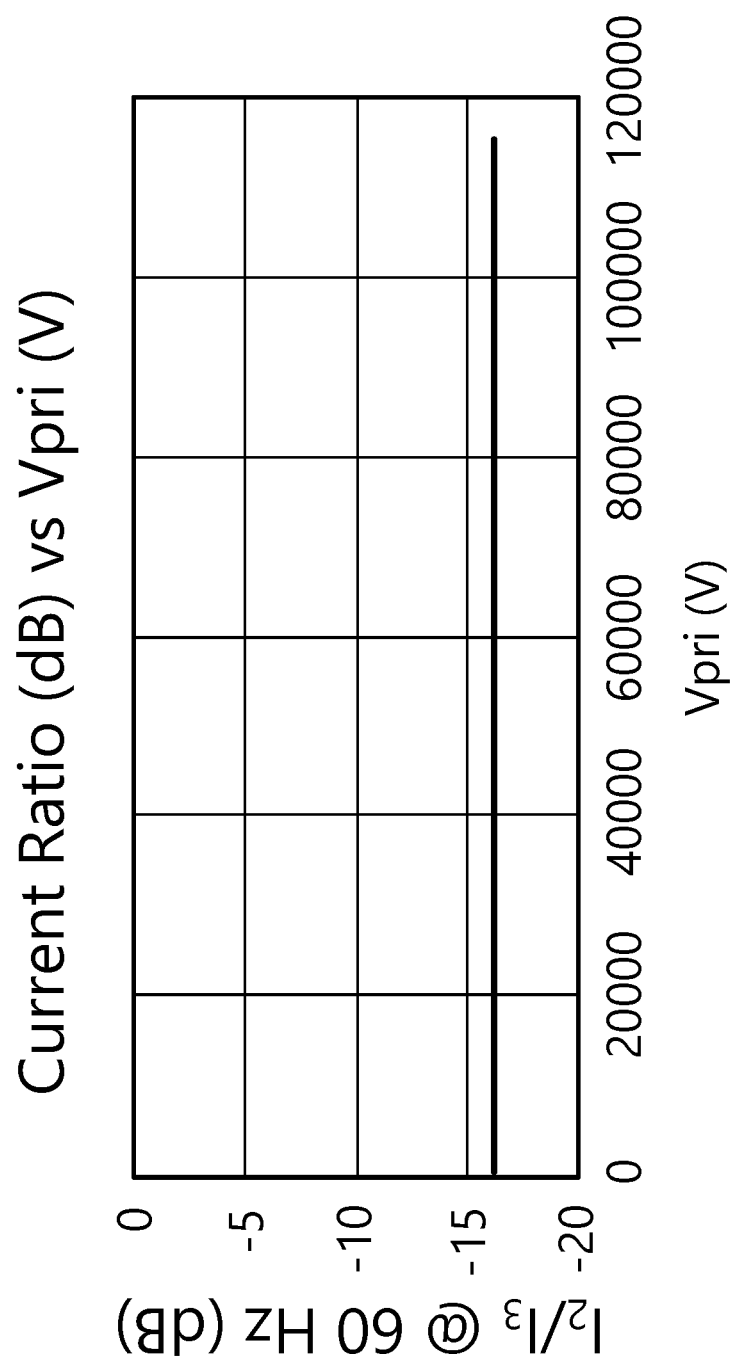
FIG. 6 illustrates a plot of current ratio vs primary voltage.
Figure 7:
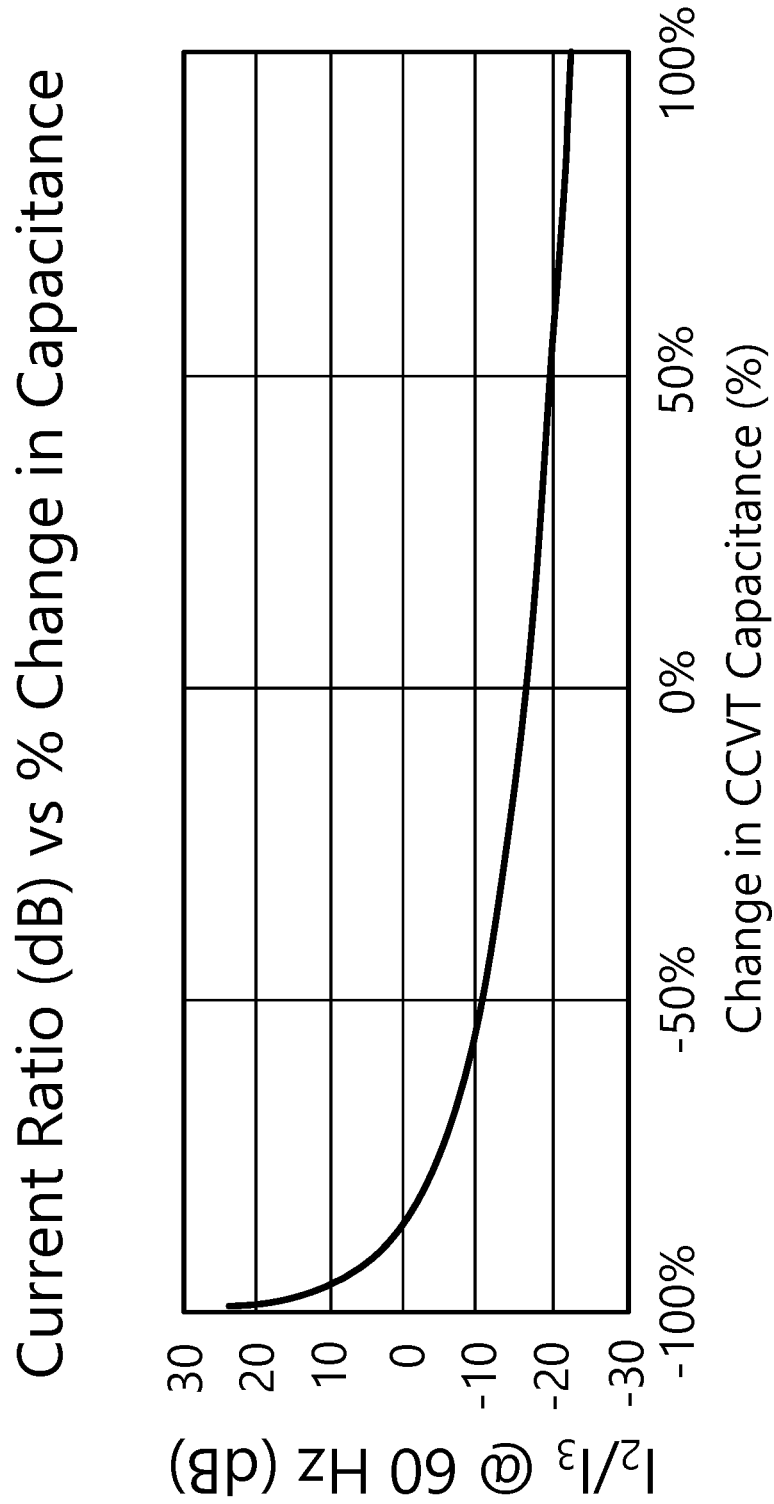
FIG. 7 illustrates a plot of current ratio vs a change in capacitance.

FIG. 6 illustrates a ratio of currents $I_2$ to $I_3$ at a single frequency (60 Hz) across a range of voltages from 100 V to 115 kV. It can be seen that the ratio of the currents $I_2$ to $I_3$ at a single frequency holds constant. FIG. 7 illustrates the ratio of the currents $I_2$ to $I_3$ at a single frequency (60 Hz) as the capacitance of the CCVT changes. Accordingly, a change in the ratio of the currents $I_2$ to $I_3$ may be used to indicate a change in the CCVT, even if the various capacitor stacks of the CCVT change by the same percentage in the same direction. The change in capacitance of the CCVT may be indicative of decreased health of the CCVT. Accordingly, systems and methods herein may monitor the ratio of the currents $I_2$ to $I_3$ at a single frequency to monitor the health of the CCVT.

While Equations 11-13 are developed with reference to a single frequency common to both $Z_3$ and $Z_2$, it is understood that the merits of Equations 11-13 can be utilized with respect to ranges of frequencies.

Accordingly, a ratio of measurements (currents, impedances, or even voltages calculated by integrating the currents) may be determined and monitored to determine a health of the CCVT. As used herein, the ratio of measurements may be referred to as a health factor of the CCVT. Thus, embodiments herein may monitor the health of a CCVT by calculating a health factor from measurements representing current through different portions of the CCVT. In several embodiments, the health factor may be a ratio of currents at a particular frequency or range of frequencies. In other embodiments, the health factor may be a ratio of impedances at a particular frequency or range of frequencies. In other embodiments, the health factor may be a ratio of voltages calculated from currents at a particular frequency or range of frequencies. In still other embodiments, the health factor may be other quantities calculated using measurements from different portions of the CCVT.

Figure 8A:
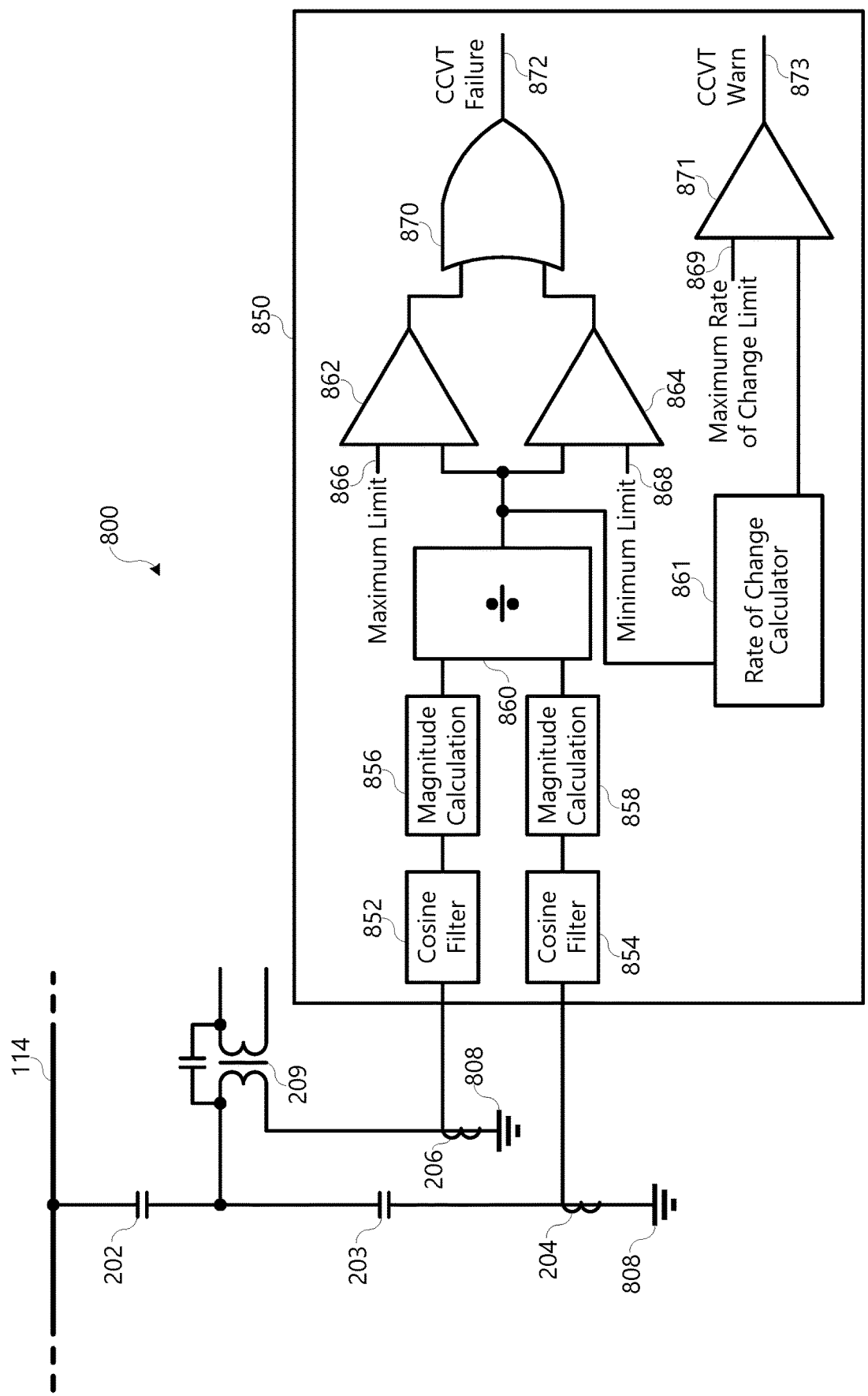
FIG. 8A illustrates a functional block diagram of a device for monitoring a CCVT.

FIG. 8A illustrates a functional block diagram of a system 800 for monitoring a CCVT in accordance with several embodiments herein. The system includes a device 850 such as an IED for monitoring the CCVT. The device 850 obtains current signals from CT 204 and CT 206 which are in electrical communication with the ground leads of the CCVT and the step-down transformer 206. Signals from the CTs 204, 206 may be filtered using cosine filters 852, 854. As stated above, the impedances $Z_2$ and $Z_3$, and the ratio of the impedances $Z_2$ and $Z_3$ are constant for a healthy CCVT. Following Equation 13, the ratio of the currents $I_2$ to $I_3$ at a single frequency may be used in place of the ratio of the impedances to monitor the health of the CCVT. Accordingly, the cosine filters 852, 854 may be used to extract phasors of the current signals from CTs 204, 206 at a single frequency, such as, for example, the fundamental frequency.

Magnitudes of the outputs of the cosine filters 852, 854 may be determined using magnitude calculators 856, 858. Thus, a ratio of the magnitudes of the current signals from CTs 206 and 204 at a single frequency may be determined using ratio calculator 860. As has been illustrated above, for a healthy CCVT, the ratio at a single frequency should be constant. Accordingly, comparators 862, 864 may be used to determine whether the ratio remains within a healthy range. In comparator 862 the ratio is compared against a maximum limit 866; and in comparator 864 the ratio is compared against a minimum limit 868. The maximum limit 866 and minimum limit 868 may be predetermined limits. In various embodiments, the maximum limit 866 and the minimum limit 868 may be calculated using values of the ratio from calculator 860 during healthy-state operation of the CCVT. The maximum limit 866 and minimum limit 868 may be calculated based on a percentage of the healthy-state operation of the CCVT. For example, a healthy value of the ratio may be predetermined or calculated using an output of ratio calculator 860 during healthy-state operation of the CCVT. The maximum limit 866 may be calculated as 10% above the healthy value of the ratio, and the minimum limit 868 may be calculated as 10% below the healthy value of the ratio. Various other minimum and maximum limits may be used.

If the ratio from ratio calculator 860 is greater than the maximum limit 866, comparator 862 asserts its output to the input of OR gate 870. If the ratio from the ratio calculator 860 is less than the minimum limit 868, then comparator 864 asserts its output to the input of OR gate 870. The OR gate 870 asserts a CCVT failure signal 872 upon assertion from either of the comparators 862, 864. The CCVT failure signal 872 may be used to notify operators of a status of the CCVT operating outside of the predetermined healthy condition. The system may display or send an alert of the CCVT operating outside of the predetermined healthy condition. The system may take a protective action upon assertion of the CCVT failure signal 872 such as, for example, opening a circuit breaker to remove power to the CCVT.

As capacitor elements in the CCVT capacitor stack begin to fail, increased voltage and stress is applied to the remaining healthy capacitors. This can lead to an increased rate of failure over time producing an avalanche failure mode and a possible explosion. Although the ratio from ratio calculator 860 may be within the maximum limit 866 and minimum limit 868, the ratio rate of change may exceed a rate of change limit which indicates likely CCVT failure. Accordingly, the device 850 may employ a rate of change calculator 861 which calculates the rate of change of the ratio from the ratio calculator 860. The ratio calculator may compute the difference between consecutive samples of the ratio or may compare the current ratio to a record of ratio values over time to determine a rate of change. The rate of change is compared to a maximum rate of change limit 869 using comparator 871. If the rate of change exceeds the maximum rate of change limit 869, then the comparator 871 asserts a CCVT warning signal 873 which can alert the user to an imminent CCVT failure.

Although FIG. 8A illustrates a particular embodiment of a system to monitor a CCVT, different embodiments are contemplated. For example, instead of determining a ratio of magnitudes of the current signals at a single frequency, and comparing the ratio against minimum and maximum limits, the system may calculate voltages from the CTs 204, 206 by integrating the current signals from CTs 204, 206, and comparing a ratio of the voltage magnitudes. In other embodiments, the device 850 may be implemented to monitor the power system using high-fidelity voltage signals from the current signals from CTs 204, 206. These voltage measurements may then be differentiated to calculate current signals, which may then be used in cosine filters, magnitude calculators, ratio calculator, and comparators as illustrated in FIG. 8A.

Figure 8B:
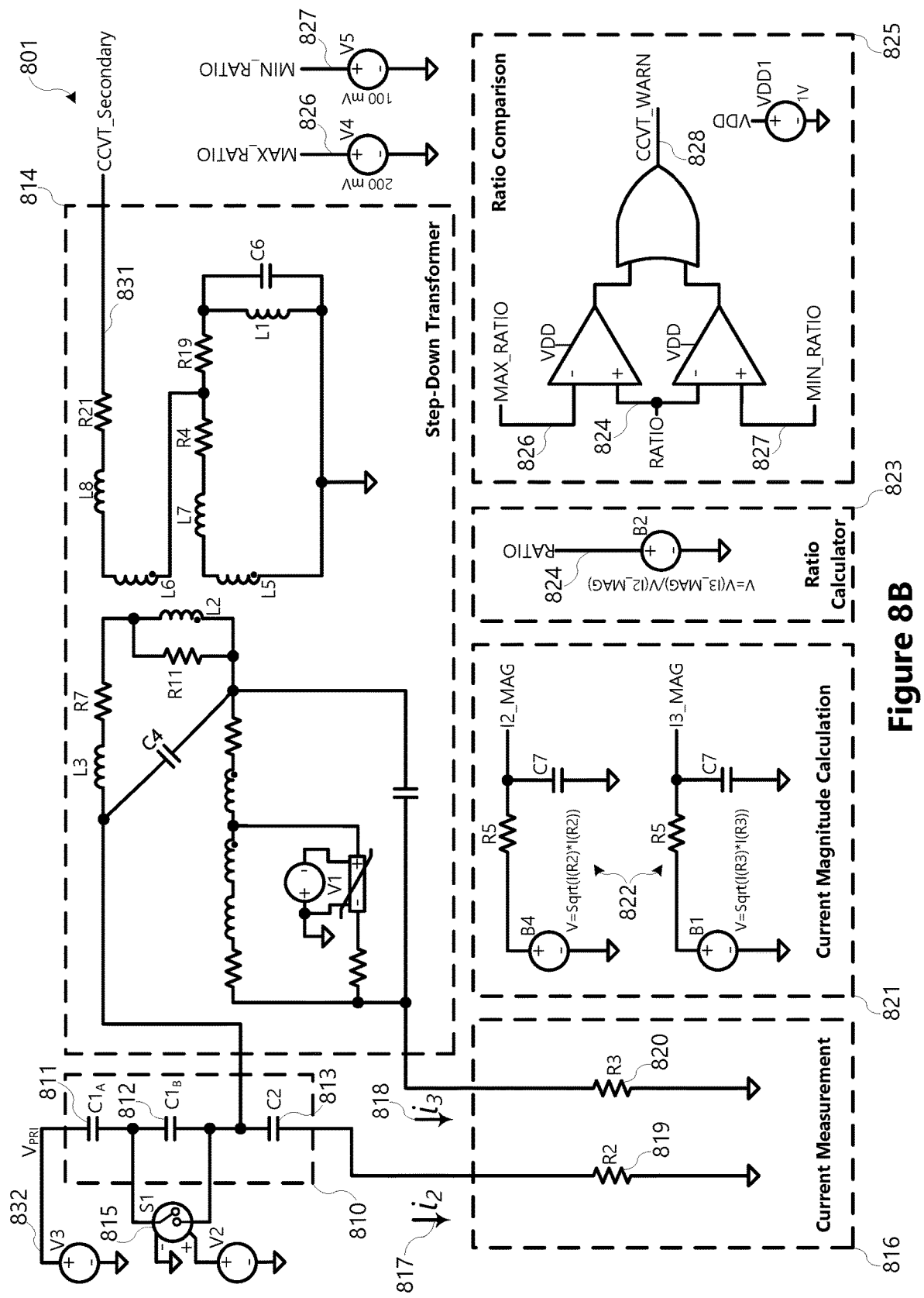
FIG. 8B illustrates a circuit diagram of a device for monitoring a CCVT.

FIG. 8B illustrates a schematic diagram 801 for simulating a system to monitor a CCVT in accordance with several embodiments herein. The capacitor stack 810 comprises a high voltage capacitor consisting of capacitor elements $C1_A$ 811 and $C1_B$ 812 and a low voltage capacitor C2813. A step-down transformer 814 is electrically connected to the capacitor stack 810. A normally open voltage-controlled switch 815 is electrically connected to the high voltage capacitor element $C1_B$ 812, and the voltage-controlled switch 815 is programmed to close at 100 ms, causing a short circuit across the terminals of high voltage capacitor element $C1_B$ 812. When the switch 815 closes, the short circuit simulates a failure of a capacitor in the capacitor stack 810.

A current measurement module 816 measures current $i_2$ 817 from the current stack 810 to ground and current $i_3$ 818 from the step-down transformer 814 to ground by means of shunt devices R2819 and R3820. A current magnitude calculator module 821 computes quantities representing magnitudes of the currents $i_2$ 817 and $i_3$ 818. As illustrated here, the magnitudes are calculated for a range of frequencies using bandpass filters 822. A ratio calculator 823 computes the ratio 824 of the magnitudes from the current magnitude calculator module 821. Finally, a ratio comparison module 825 compares the ratio 824 to a predetermined range comprising a maximum ratio 826 (which may be set at around 200 mV) and a minimum ratio 827 (which may be set at around 100 mV). If the ratio 824 exceeds the range, the ratio comparison module 825 asserts a CCVT warning signal 828.

Figure 8C:
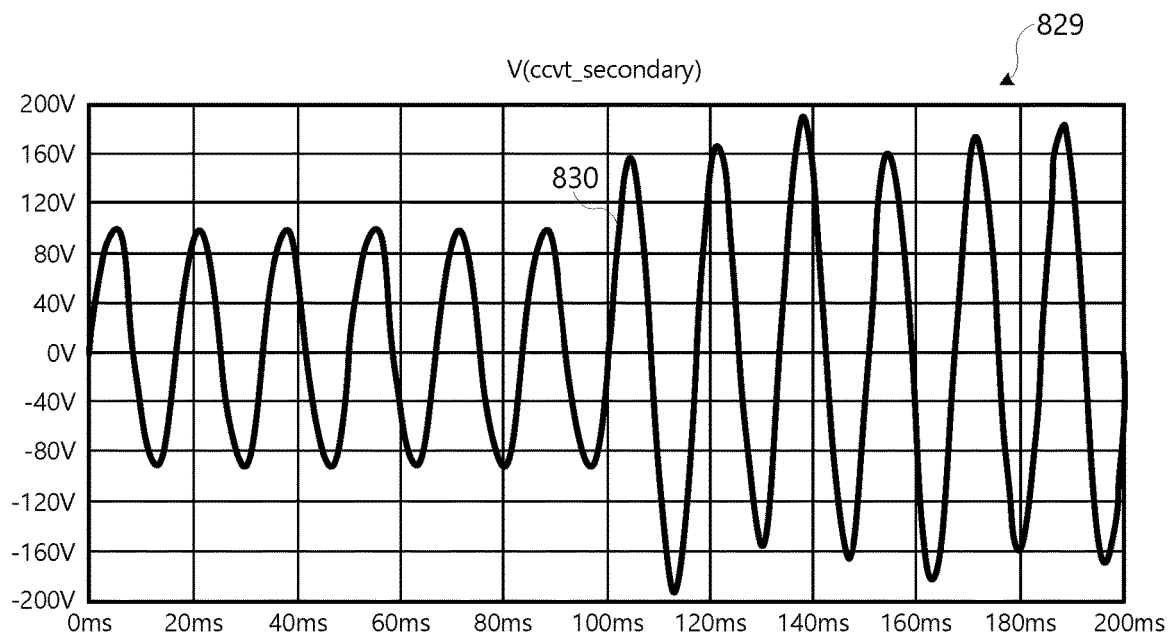
FIG. 8C illustrates a plot of CCVT secondary voltage versus time.

FIG. 8C illustrates a plot 829 of the CCVT voltage 830 from the CCVT secondary 831 in the schematic diagram 801 in FIG. 8B. At 100 ms, the CCVT voltage 830 has an increase in magnitude due to the failure in the capacitor stack 810 simulated by switch 815. An IED monitoring the CCVT secondary voltage 831 cannot determine whether the step at 100 ms in the plot 829 represents a failure of the electronic delivery system (i.e., a change in the primary voltage $V_{PRI}$ 832), a failure of the capacitor stack 810, or a failure of the step-down transformer 814. The CCVT voltage 830 also exhibits a CCVT transient after the simulated capacitor failure at 100 ms.

Figure 8D:
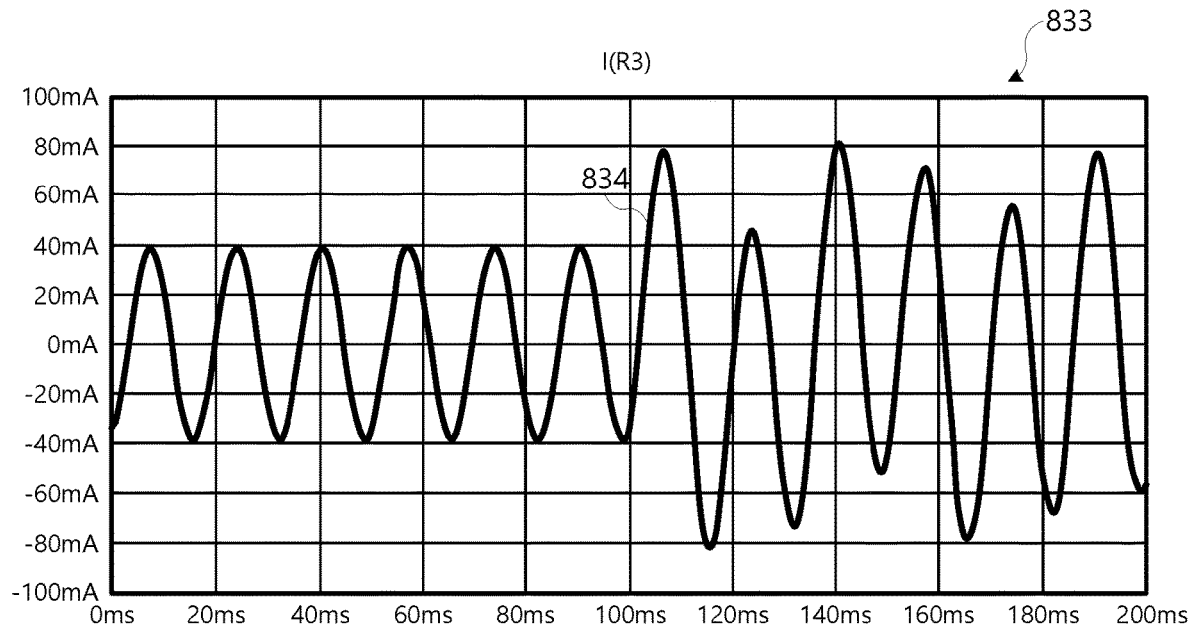
FIG. 8D illustrates a plot of current versus time.

FIG. 8D illustrates a plot 833 of the current 834, which is equal to $i_3$ 818 through the step-down transformer 814, measured through current shunt R3820. The similarities between the CCVT voltage 830 in FIG. 8C and the current 834 through the step-down transformer 814 in FIG. 8D are noted. According to embodiments described herein, an IED may monitor a current associated with the CCVT and compare it with a secondary voltage of the CCVT to monitor the health of the CCVT. In particular, the similarities between the current 834 and voltage 830 illustrate that a failure of the step-down transformer 814 has not occurred and may allow an IED to limit diagnosis of the event occurring at 100 ms to either a failure of the capacitor stack 810 or a change in primary voltage 832. In some embodiments, the IED may calculate a health supervisory signal using the secondary voltage of the CCVT and a current associated with the CCVT such as $i_1$, $i_2$, or $i_3$. The secondary voltage and the current may be at a common frequency. The health supervisory signal may be a ratio of the magnitudes of the secondary voltage and the current at a common frequency. The IED may compare the health supervisory signal against an acceptable range, which may be predetermined, static, or dynamic based on operating conditions. When the health supervisory signal does not exceed the acceptable range, then the IED may determine that a failure of the step-down transformer 814 has not occurred, such that when the health factor does exceed its acceptable range (the CCVT_WARN signal is issued), then the IED may determine that the failure is in the capacitor stack 810 or a change in the primary voltage. When both the health supervisory signal exceeds its acceptable range and the health factor exceeds its acceptable range, then the IED may determine that the failure may be in the capacitor stack 810, the step-down transformer 814, a change in primary voltage, or the like. Finally, when the health supervisory signal exceeds its acceptable range but the health factor does not exceed its acceptable range, then the IED may determine that the failure is outside of the capacitor stack 810.

Figure 8E:
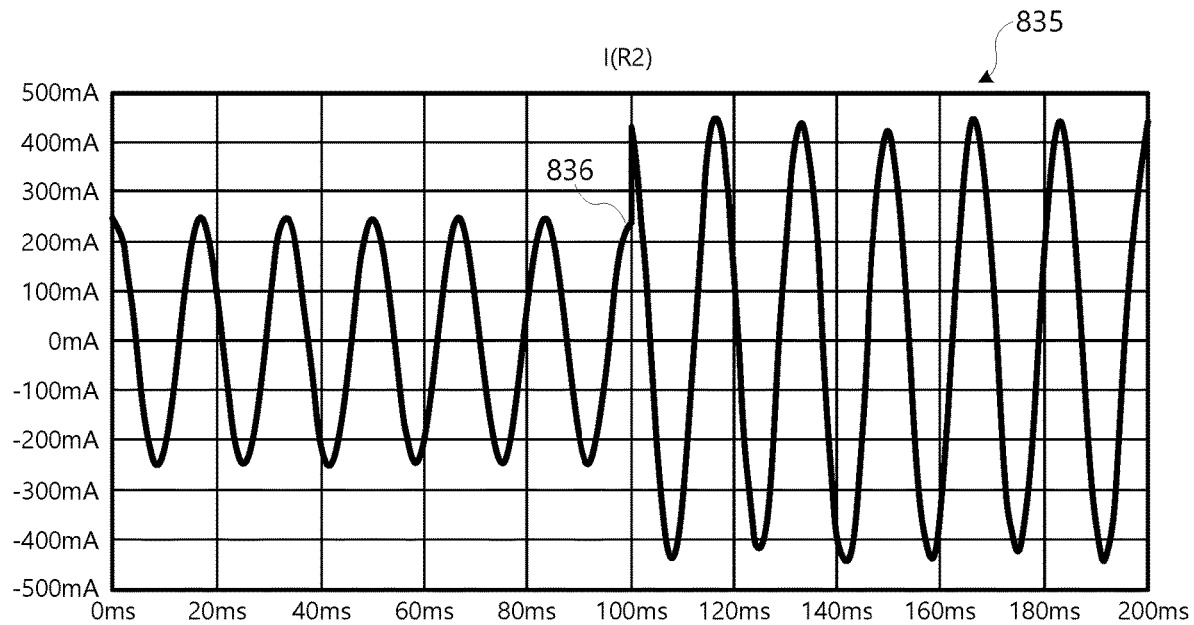
FIG. 8E illustrates a plot of current versus time.

FIG. 8E illustrates a plot 835 of the current 836 through the capacitor stack 810, measured through current shunt R2 819.

Figure 8F:
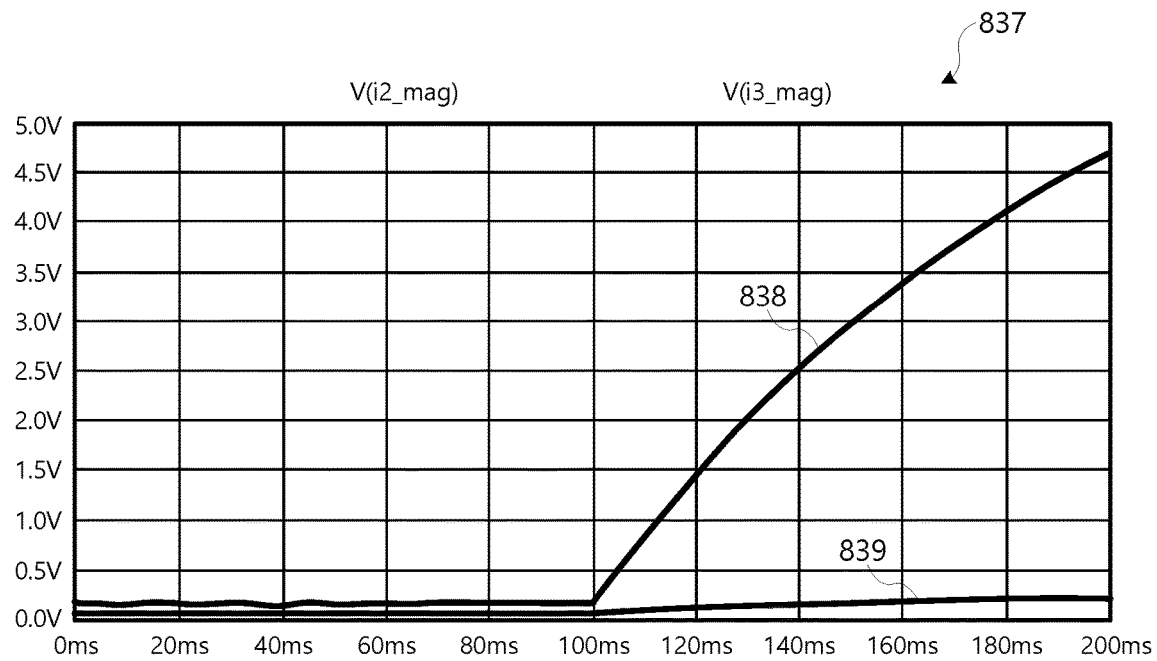
FIG. 8F illustrates a plot of voltage magnitudes versus time.

FIG. 8F illustrates a plot 837 of voltage quantities representing magnitudes of currents $i_2$ 817 and $i_3$ 818. The voltage magnitude 838 related to $i_2$ shows a large increase immediately following the simulated failure of the capacitor stack 810. The voltage magnitude 839 related to $i_3$ shows an increase after the simulated failure of the capacitor stack 810, but the increase in the voltage magnitude 839 related to $i_3$ is significantly lower than the increase in the voltage magnitude 838 related to $i_2$.

Figure 8G:
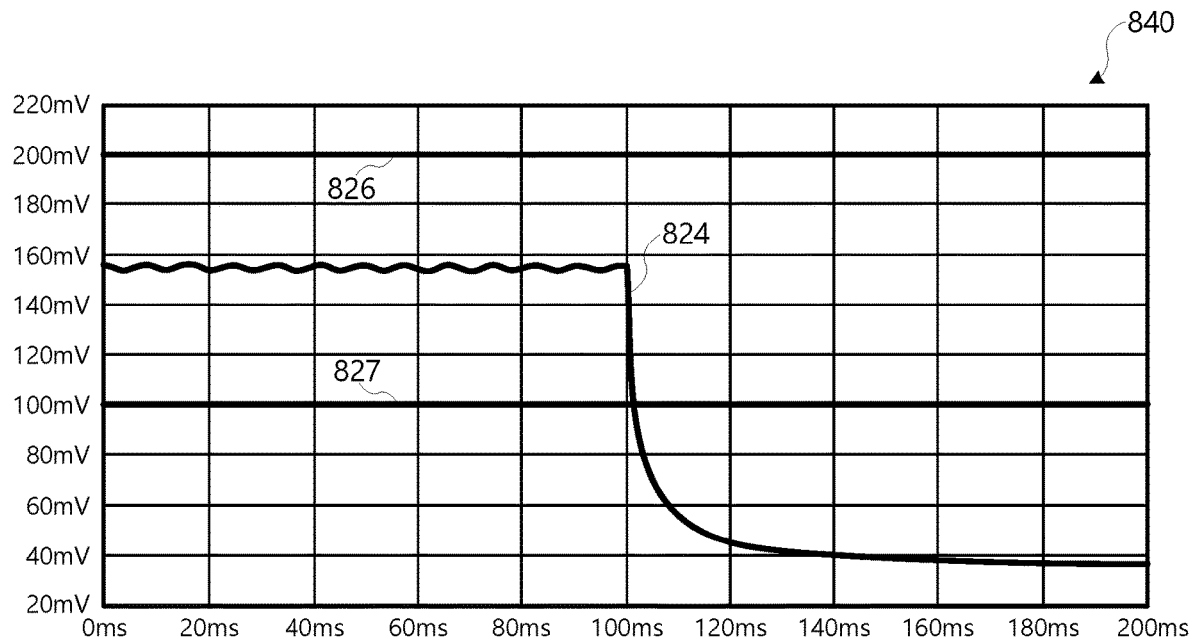
FIG. 8G illustrates a plot of voltage ratio versus time.

FIG. 8G illustrates a plot 840 of the ratio voltage 824 (e.g. from the ratio calculator 823, where the ratio voltage is related to a ratio of the currents at a particular frequency). Also shown are the plots of the maximum ratio 826 and minimum ratio 827. The health range is illustrated between the maximum ratio 826 and minimum ratio 827. After 100 ms, ratio voltage 824 drops below the minimum ratio threshold 827. Although descriptions of the ratio as developed in Equations 11-13 assume ideal cases where the ratio is constant, it is clear that the health factor may take many forms and may not be constant when computed from a range of frequencies or from non-ideal magnitude calculations. In various embodiments, the health range is predetermined. The maximum ratio 826 and minimum ratio 827 may be constant, and in various embodiments may be predetermined. Furthermore, it is contemplated that the maximum ratio 826 and minimum ratio 827 values may not be constant and may be adjusted dynamically based on various measurements, calculations, or conditions, resulting in a dynamic health range. By means of example, the acceptable health range may be adjusted based on a temperature measurement of the CCVT. Additionally, the acceptable health range may be adjusted with time to adjust for the aging of the CCVT. The acceptable health range may also be adjusted based on the rate of ratio change.

Figure 8H:
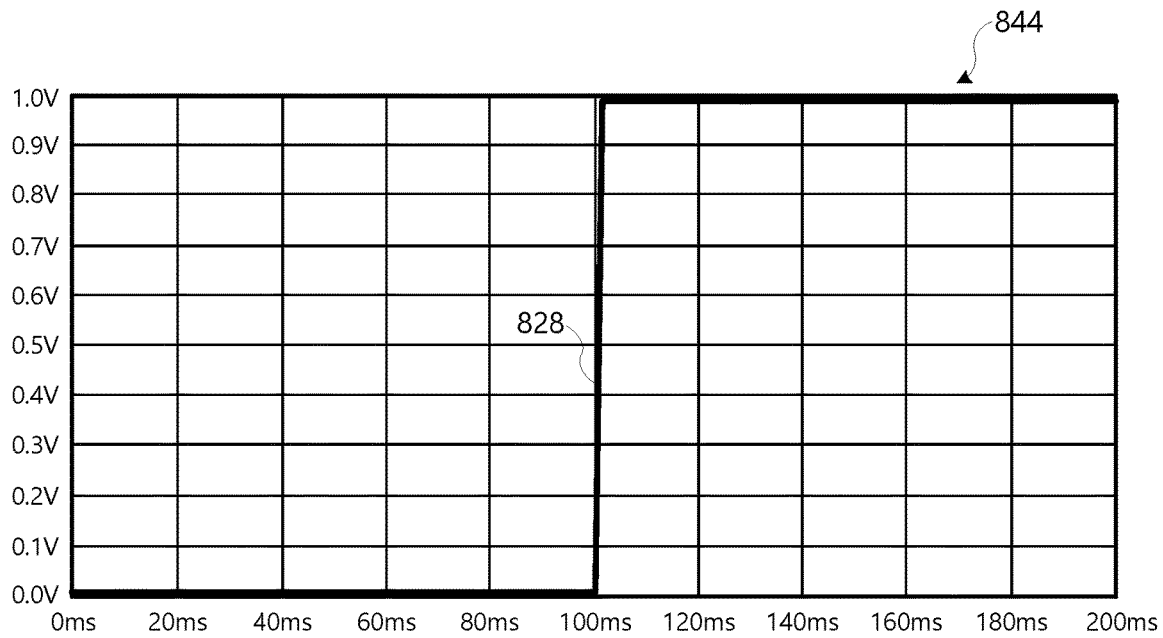
FIG. 8H illustrates a plot of a warning signal versus time.

FIG. 8H illustrates a plot 844 of the CCVT warning signal 828. After 100 ms, the warning signal asserts indicating a failure of the CCVT. According to the embodiments illustrated in FIGS. 8A, 8B, 8C, 8D, 8E, 8F, and 8G, an IED may correctly identify a failure of the CCVT capacitor stack 810. In contrast, prior methods of single-phase CCVT monitoring cannot distinguish between a failure a change in the primary voltage $V_{PRI}$ 832, a failure of the capacitor stack 810, or a failure of the step-down transformer 814.

Figure 9:
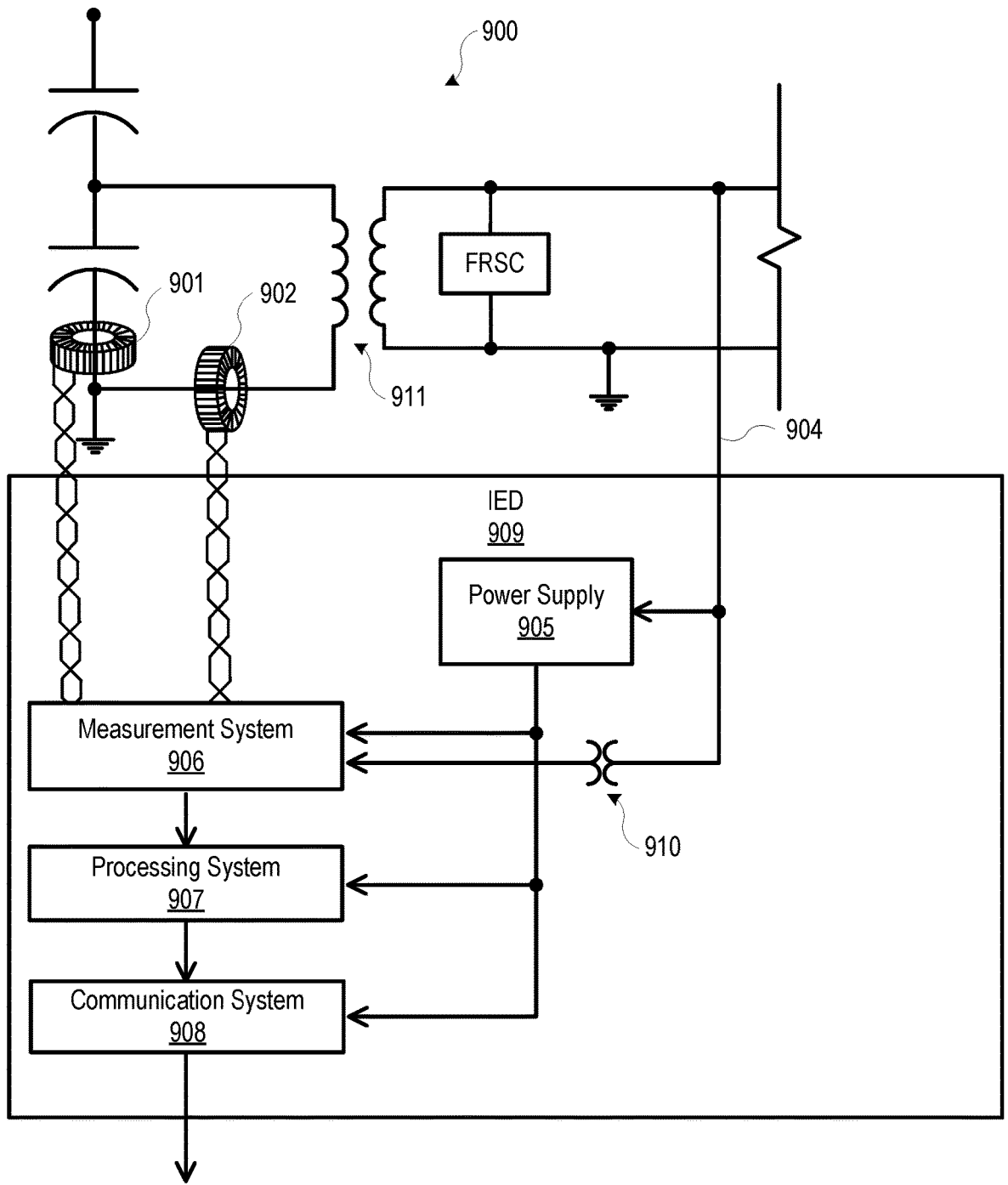
FIG. 9 illustrates a simplified block diagram of a device for monitoring a CCVT.

FIG. 9 illustrates a block diagram of a system 900 to monitor a CCVT consistent with the present disclosure. The system may further be configured to monitor an electric power delivery system using voltage signals from a CCVT. Two current transformers 901 and 902 are in electrical communication with the CCVT and the CCVT secondary voltage 904. Current transformers typically do not generate large signals, and accordingly, the length of their leads connecting to the device implementing the present invention may be limited. As a result, the IED 909 may be installed in a proximity to the CCVT. In one embodiment, the IED 909 may be installed in the substation switchyard.

In the illustrated embodiment, power for an IED 909 is drawn from the secondary voltage output of the CCVT 904. In alternative embodiments, power may be provided by other sources. As illustrated, a power supply 905 may provide power to other components in system 900. Power supply 905 may be designed to accept CCVT output voltage without introducing any consequential distortions to this voltage, and therefore not impacting accuracy of other end devices in system 900 or other devices connected to the same voltage 904. The connection from the secondary CCVT output to the device may be fused, but the fuse is not shown in in the interest of simplicity. A typical CCVT is rated for a burden of upwards of 100 W. The actual burden created by IED 909 may be much lower and therefore a CCVT can provide several Watts of power to power the device in system 900. In some embodiments, secondary voltage from all three power system phases may be used to power the device, thus distributing the load.

IED 909 may obtain current signals from the CCVT as described hereinabove using CTs 901 and 902. The current signals may be received by a measurement system 906 of the IED. Measurement system 906 may include an ADC to create digitized representations of the signals from current transformers 901 and 902.

The measurements are provided to a processing system 907. Processing system 907 may analyze the measurements and generate alarms and or control actions. For example, the processing system 907 may transmit the high-fidelity voltage, the secondary voltage, the alarm signal, and the trip signal using a communication system 908. Communication system 908 may communicate using a variety of communication media and protocols. In some embodiments, communication system 908 provides a representation of the high-fidelity full-scale voltage signal as an output. Still further, communication system 908 may provide a representation of the voltage derivative directly as a representation of a voltage traveling waves. In some embodiments, communication system 908 may communicate via a fiber optic medium. Other forms of communication media may also be used.

In some embodiments, the measurements from communication system 908 may be used by other IEDs to perform monitoring functions such as electric power system monitoring or CCVT monitoring. In other embodiments, the IED 909 may be configured to apply monitoring functions to CCVT as described herein. For example, the processing system 907 may be configured to determine a ratio of current magnitudes at a single frequency from CTs 901 and 902 or voltage magnitudes to determine a ratio and compare the ratio against predetermined maximum and minimum limits as described herein.

The secondary voltage output 904 of the CCVT is proportional to the current through CT 902. In some embodiments, the IED 909 may compare the difference between current through CT 902 and the secondary voltage output of the CCVT 904 with predetermined maximum and minimum limits. The IED may use this comparison to warn of secondary transformer 911 failure or may use the information to validate other CCVT monitoring functions. For example, a loss of potential (LOP) monitoring method may be commonly employed by other IEDs monitoring the secondary voltage output of the CCVT 904. If an IED reports a LOP, the monitoring IED 909 may report the failure location. If, for example, the ratio of current magnitudes at a single frequency from CTs 901 and 902 are within the predetermined maximum and minimum limits, then the failure may be reported to occur on the secondary side of the CCVT transformer 911.

Figure 10:
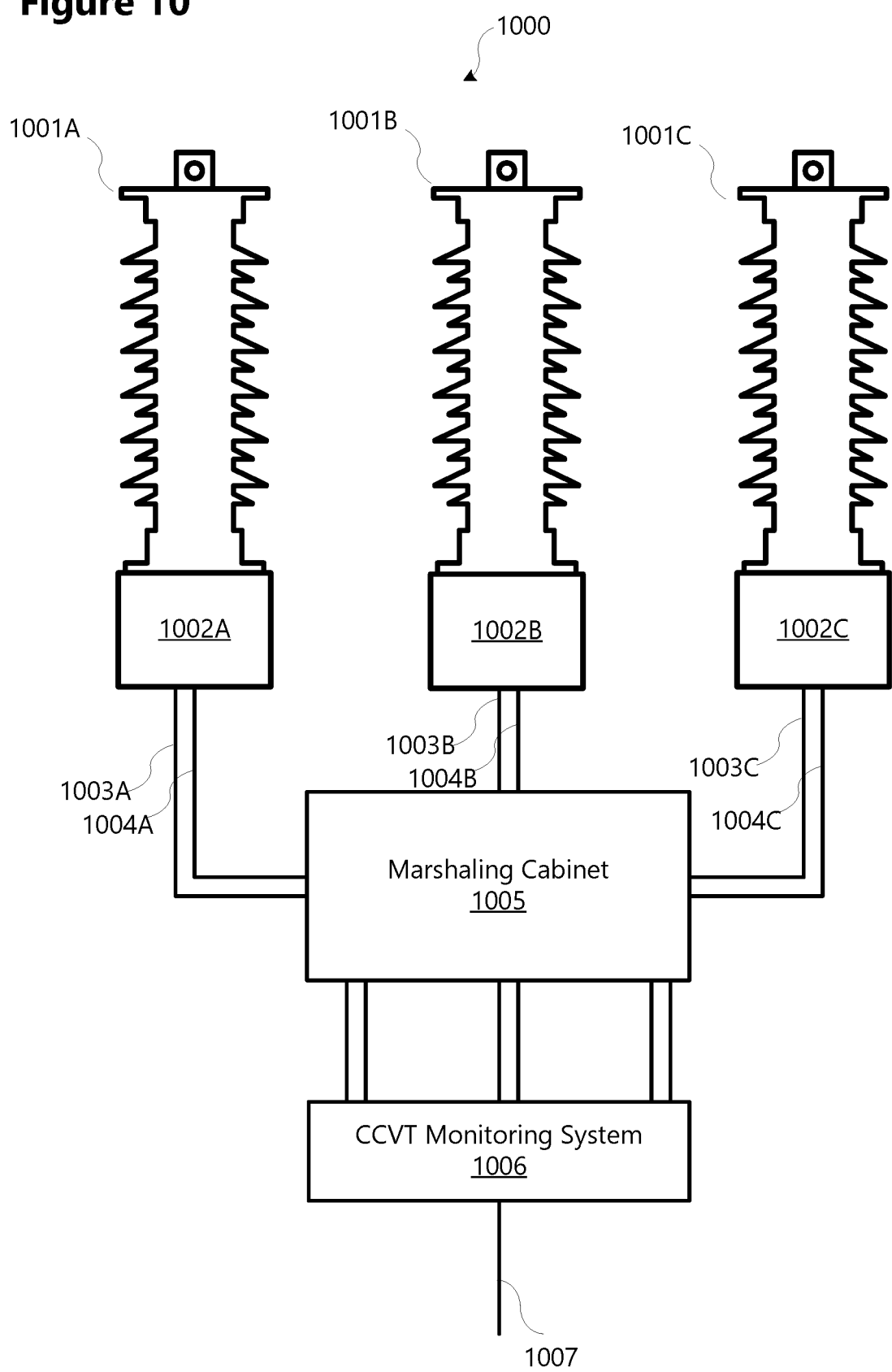
FIG. 10 illustrates a simplified diagram of a three-phase CCVT system and monitoring system in accordance with the embodiments herein.

FIG. 10 illustrates a representation of the placement of a system consistent with respect to a CCVT consistent with embodiments of the present disclosure. A CCVT monitoring system 1006 consistent with the present disclosure may be disposed in a substation switchyard in proximity to the marshaling cabinet 1005. The signals of interest may be provided to other devices, via a communication channel 1007. In some embodiments, the other devices may be located in the control house. The communication channel 1007 may be embodied as a fiber optic connection or other type of communication media.

The marshaling cabinet 1005 is typically a part of a practical CCVT installation. It allows a cross-connection and demarcation point between the voltage control cables that run toward the control house and the single-phase CCVTs 1001A, 1001B, and 1001C in the switchyard. These CCVTs serve the A, B, and C phases of the three-phase power system, and may have their own cabinets 1002A, 1002B, and 1002C at the bottom. A CCVT monitoring system consistent with the present disclosure may place the current transformers inside the 1002A, 1002B, and 1002C cabinets and may be connected via shielded twisted-pair cables 1003A, 1003B, and 1003C to the marshaling cabinet 1005, using a similar path and conduits—if possible—as the secondary voltage cables. The secondary voltages may be connected to the marshaling cabinet 1005 with the single-phase voltage cables 1004A, 1004B, and 1004C. The CCVT monitoring system 1006 may be placed inside the marshaling cabinet 1005 if space permits, or in its own cabinet mounted in proximity to the marshaling cabinet 1005.

Figure 11:
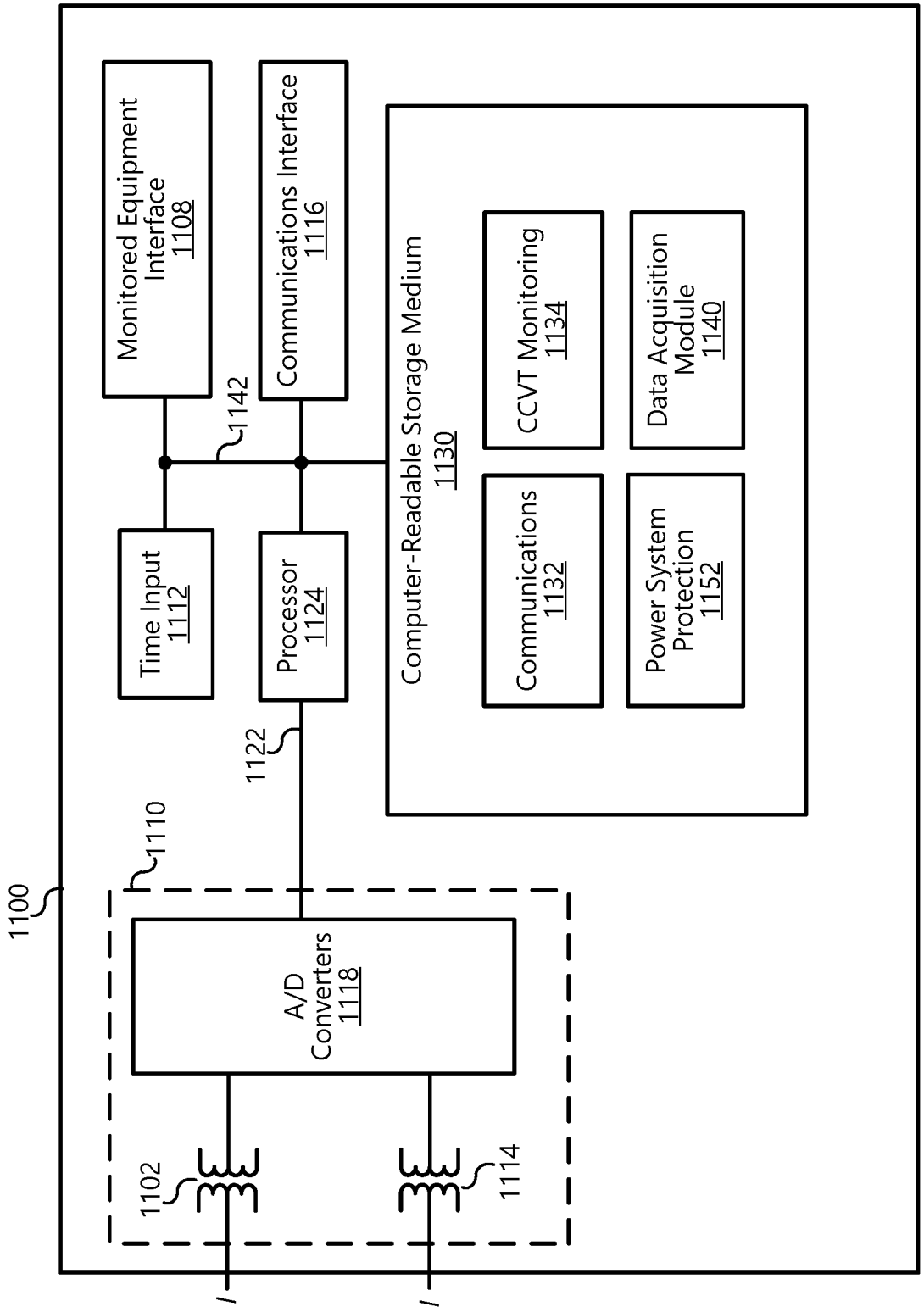
FIG. 11 illustrates a functional block diagram of a system for monitoring a CCVT.

FIG. 11 illustrates a functional block diagram of a system 1100 for detecting and locating faults using traveling waves consistent with embodiments of the present disclosure. System 1100 includes a communications interface 1116 to communicate with devices and/or IEDs. In certain embodiments, the communications interface 1116 may facilitate direct communication with other IEDs or communicate with systems over a communications network. Consistent with the embodiments of this disclosure the interface 1116 may include communications with the CCVT high-fidelity voltage IED with the intent to receive the high-fidelity voltage, the secondary CCVT voltage, voltage TWs, CCVT alarm and trip signals, or a combination of the above. Also, the communications interface 1116 may provide the said CCVT information to other devices. Communications interface 1116 may facilitate communications through a network. System 1100 may further include a time input 1112, which may be used to receive a time signal (e.g., a common time reference) allowing system 1100 to apply a time-stamp to the acquired samples. In certain embodiments, a common time reference may be received via communications interface 1116, and accordingly, a separate time input may not be required for time-stamping and/or synchronization operations. One such embodiment may employ the IEEE 1588 protocol. A monitored equipment interface 1108 may receive status information from, and issue control instructions to, a piece of monitored equipment, such as a circuit breaker, conductor, transformer, or the like.

Processor 1124 may process communications received via communications interface 1116, time input 1112, and/or monitored equipment interface 1108. Processor 1124 may operate using any number of processing rates and architectures. Processor 1124 may perform various algorithms and calculations described herein. Processor 1124 may be embodied as a general-purpose integrated circuit, an application-specific integrated circuit, a field-programmable gate array, and/or any other suitable programmable logic device.

In certain embodiments, system 1100 may include a sensor component 1110. In the illustrated embodiment, sensor component 1110 gathers data directly from conventional electric power system equipment such as a conductor (not shown) using potential transformers and/or current transformers. In various embodiments, sensor component 1110 may be in electrical communication with a clamp-on CT in a CCVT as described in connection with various embodiments of the present disclosure. The sensor component 1110 may use, for example, transformers 1102 and 1114 and A/D converters 1118 that may sample and/or digitize filtered waveforms to form corresponding digitized current and voltage signals provided to data bus 1122. A/D converters 1118 may include a single A/D converter or separate A/D converters for each incoming signal. A current signal may include separate current signals from each phase of a three-phase electric power system. A single line diagram is shown only for the sake of clarity.

A/D converters 1118 may be connected to processor 1124 by way of data bus 1122, through which digitized representations of current and voltage signals may be transmitted to processor 1124. In various embodiments, the digitized current and voltage signals may be used to calculate time-domain quantities for the detection and the location of a fault on an electric power system as described herein.

A computer-readable storage medium 1130 may be the repository of various software modules to perform any of the methods described herein. A data bus 1142 may link monitored equipment interface 1108, time input 1112, communications interface 1116, and computer-readable storage medium 1130 to processor 1124.

Communications module 1132 may allow system 1100 to communicate with any of a variety of external devices via communications interface 1116. Communications module 1132 may be configured for communication using a variety of data communication protocols (e.g., UDP over Ethernet, IEC 61850, etc.).

Data acquisition module 1140 may collect data samples such as the current and voltage quantities. The data samples may be associated with a timestamp and made available for retrieval and/or transmission to a remote IED via communications interface 1116. Data acquisition module 1140 may operate in conjunction with CCVT monitoring module 1134. Data acquisition module 1140 may control recording of data used by the CCVT monitoring module 1134. According to one embodiment, data acquisition module 1140 may selectively store and retrieve data and may make the data available for further processing. Such processing may include processing by CCVT monitoring module 1134, which may determine the occurrence of a fault within an electric power distribution system.

A protective action module 1152 may implement a protective action based on a declaration of a fault and/or a signal of failing CCVT health from the CCVT monitoring module 1134. In various embodiments, a protective action may include tripping a breaker, selectively isolating a portion of the electric power system, etc. In various embodiments, the protective action module 1152 may coordinate protective actions with other devices in communication with system 1100.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor must the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be implemented as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory computer and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of machine-readable media suitable for storing electronic and/or processor executable instructions.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. A system to monitor the health of a capacitance-coupled voltage transformer (CCVT) of an electric power delivery system, comprising:
   a CCVT in electrical communication with the electric power delivery system, the CCVT comprising a stack of capacitors and an electrical contact to a first ground connection;
   a first current measurement device disposed between the stack of capacitors and the first ground connection, the first current measurement device to provide a first electrical signal corresponding to a first current flowing through the CCVT;
   a step-down transformer comprising a primary winding electrically connected to the stack of capacitors;
   a second current measurement device electrically coupled to the step-down transformer, the second current measurement device to provide a second electrical signal corresponding to a second current flowing through the step-down transformer;
   an intelligent electronic device (IED) in electrical communication with the first and second current measurement devices, to:
      receive the first electrical signal from the first current measurement device;
      receive the second electrical signal from the second current measurement device;
      calculate a health factor for a common frequency from the first and second electrical signals;
      compare the health factor against a health range; and
      when the health factor exceeds the health range, signal an alarm.

2. The system of claim 1, wherein the health factor comprises a ratio of currents from the first and second current measurements.

3. The system of claim 1, wherein the IED is further to:
   calculate first and second currents at a fundamental frequency using cosine filters.

4. The system of claim 3, wherein the health factor comprises a ratio of current magnitudes from the first and second currents at the fundamental frequency.

5. The system of claim 1, wherein the IED is further configured to:
   calculate a rate of change of the health factor;
   compare the rate of change to a limit; and,
   signal an alarm when the rate of change exceeds the limit.

6. The system of claim 1, wherein the common frequency comprises a common frequency range.

7. The system of claim 1, wherein the health range is calculated from measurements obtained during healthy operation of the CCVT.

8. The system of claim 1, wherein the health factor at the common frequency comprises a ratio of voltages calculated by integrating the first and second current measurements.

9. The system of claim 1, wherein the IED is further configured to monitor the electric power delivery system using the first and second current measurements.

10. The system of claim 1, wherein the second current measurement device is electrically coupled between a primary winding of the step-down transformer and ground.

11. The system of claim 10, wherein the second current measurement device is electrically coupled between the primary winding and the first ground connection.

12. The system of claim 10, wherein the second current measurement device is electrically coupled between the primary winding and a second ground connection.

13. The system of claim 1, wherein:
   the step-down transformer comprises:
      a primary winding electrically connected to the stack of capacitors; and
      a secondary winding electrically connected to a third ground connection; and,
   a third current measurement device is disposed between the secondary winding and the third ground connection to provide a third electrical signal corresponding to a third current flowing through the primary winding.

14. The system of claim 1, wherein:
   the first ground connection is electrically connected to the CCVT chassis;
   the CCVT chassis is electrically connected to a third ground; and,
   the first current measurement device is disposed between the CCVT chassis and the third ground.

15. The system of claim 1, wherein:
   the step-down transformer comprises a voltage output; and,
   the IED is further configured to:
      receive a voltage signal from the voltage output;
      calculate a health supervisory signal using the voltage signal and the second electrical signal from the second current transformer; and,
      compare the health supervisory signal with an acceptable range; and
      signal the alarm when the health supervisory signal exceeds the acceptable range.

16. The system of claim 1, further comprising a communication system to communicate the alarm to other devices associated with the electric power delivery system.

17. A method for monitoring the health of a capacitance-coupled voltage transformer (CCVT) of an electric power delivery system, comprising:
   obtaining a first current measurement from a first current measurement device in electrical communication with the CCVT between a stack of capacitors of the CCVT and an electrical ground;
   obtaining a second current measurement from a second current measurement device in electrical communication with a step-down transformer of the CCVT;
   calculating a health factor from the first current measurement to the second current measurement for a common frequency;
   comparing the health factor against a range; and,
   when the ratio exceeds the range, signaling an alarm.

18. The method of claim 17, further comprising:
   calculating a rate of change from the health factor;
   comparing the rate of change to a limit; and,
   signaling an alarm when the rate of change exceeds the limit.

19. The method of claim 17, wherein the second current measurement device is electrically coupled between a primary winding of the step-down transformer and ground.

20. The method of claim 17, wherein the range is calculated from measurements obtained during healthy operation of the CCVT.

\* \* \* \* \*